US012742810B2

(12) United States Patent
Saes et al.

(10) Patent No.: US 12,742,810 B2
(45) Date of Patent: Sep. 22, 2026

(54) SYSTEMS AND METHODS FOR FAULT MANAGEMENT AND PROTECTION

(71) Applicant: ABL IP HOLDING, LLC, Atlanta, GA (US)

(72) Inventors: Marc Paul Saes, Gemert (NL); Stephen H. Lydecker, Atlanta, GA (US)

(73) Assignee: ABL IP HOLDING, LLC, Atlanta, GA (US)

( * ) Notice: Subject to any disclaimer, the term of this patent is extended or adjusted under 35 U.S.C. 154(b) by 79 days.

(21) Appl. No.: 18/823,250

(22) Filed: Sep. 3, 2024

(65) Prior Publication Data

US 2025/0076363 A1 Mar. 6, 2025

Related U.S. Application Data

(60) Provisional application No. 63/536,491, filed on Sep. 4, 2023.

(51) Int. Cl.

*G01R 31/08* (2020.01)
*H02H 1/00* (2006.01)
*H02J 4/00* (2026.01)
*H02J 105/12* (2026.01)

(52) U.S. Cl.

CPC ......... *G01R 31/086* (2013.01); *H02H 1/0015* (2013.01); *H02H 1/0076* (2013.01); *H02J 4/00* (2013.01); *H02J 2105/12* (2026.01)

(58) Field of Classification Search

CPC ...... G01R 31/00; G01R 31/08; G01R 31/081; G01R 31/086; H02H 1/00; H02H 1/0007; H02H 1/0015; H02H 1/0061; H02H 1/0076; H02J 4/00; H02J 2105/00; H02J 2105/10; H02J 2105/12

USPC ........................................ 324/500, 512, 522

See application file for complete search history.

(56) References Cited

U.S. PATENT DOCUMENTS 4,556,883 A * 12/1985 Strietzel ................ G01S 13/825 342/174
7,924,160 B1 * 4/2011 LaPenta ............. G08B 13/2422 340/539.13

FOREIGN PATENT DOCUMENTS

| | | | | | |
|---|---|---|---|---|---|
| CN | 1380235 | A | * | 11/2002 | ................ H02J 3/00 |
| CN | 216118452 | U | * | 3/2022 | ............. G01R 31/00 |
| CN | 115460647 | B | * | 6/2023 | .......... H02J 13/1331 |
| KR | 102347172 | B1 | * | 1/2022 | ........... G08B 21/185 |
| WO | WO-2023005431 | A1 | * | 2/2023 | ........... H04B 10/071 |

* cited by examiner

*Primary Examiner* — Hoai-An D. Nguyen
(74) *Attorney, Agent, or Firm* — Secant IP, PLLC

(57) ABSTRACT

The present disclosure provides distributed power and fault management systems. In one example embodiment, a single power transmitter is coupled to a plurality of power receiver devices via a low-ohmic connection. Each power receiver device is configured to provide local power, and to communicate power input information with the transmitter. The transmitter is configured to sum the power input of each receiver and compare the sum to an output power to determine fault conditions that may be present in the system.

21 Claims, 21 Drawing Sheets

1400

| | Out: | | |
|---|---|---|---|
| **In:** | **Class-1** | **Class-4** | **Class-2/SELV** |
| **Class-1** | Daisy Chain | High P TX | Low P TX |
| **Class-4** | High P PoL | Daisy Chain | Low P PoL |
| **Class-2/SELV** | Voltage Boost | Voltage Boost | Daisy Chain |
| SELV = IEC's Safety Extra Low Voltage | | | |

FIG. 14

SYSTEMS AND METHODS FOR FAULT MANAGEMENT AND PROTECTION

CROSS REFERENCE TO RELATED APPLICATIONS

This application claims the benefit of U.S. Provisional Application Ser. No. 63/536,491, filed 4 Sep. 2023, which is hereby incorporated by reference in its entirety.

TECHNICAL FIELD

The present application relates generally to hazardous fault protection and, more particularly, to distributed power systems and methods for hazardous fault management and protection of point-of-load devices.

BACKGROUND

Residential and commercial electrical lighting systems include various combinations of power transmitters and receivers connected using cabling insulated by conduit. Different parameters are required to satisfy safety requirements based on voltage, current and/or power classes corresponding to the electrical lighting systems. For example, higher voltages require conduit use and additional safety measures to reduce hazardous conditions and incidents such as arc faults resulting in electrical shock and/or fire to persons and property. These additional safety requirements are costly, resulting in limited design options for electrical lighting systems.

BRIEF DESCRIPTION OF THE DRAWINGS

Reference should be made to the following detailed description which should be read in conjunction with the following figures, wherein like numerals represent like parts.

FIG. 14 illustrates an example of a table of potential use cases for a power converter, or pass-through hub, in accordance with an embodiment of the present disclosure;

DETAILED DESCRIPTION

Figure 1:
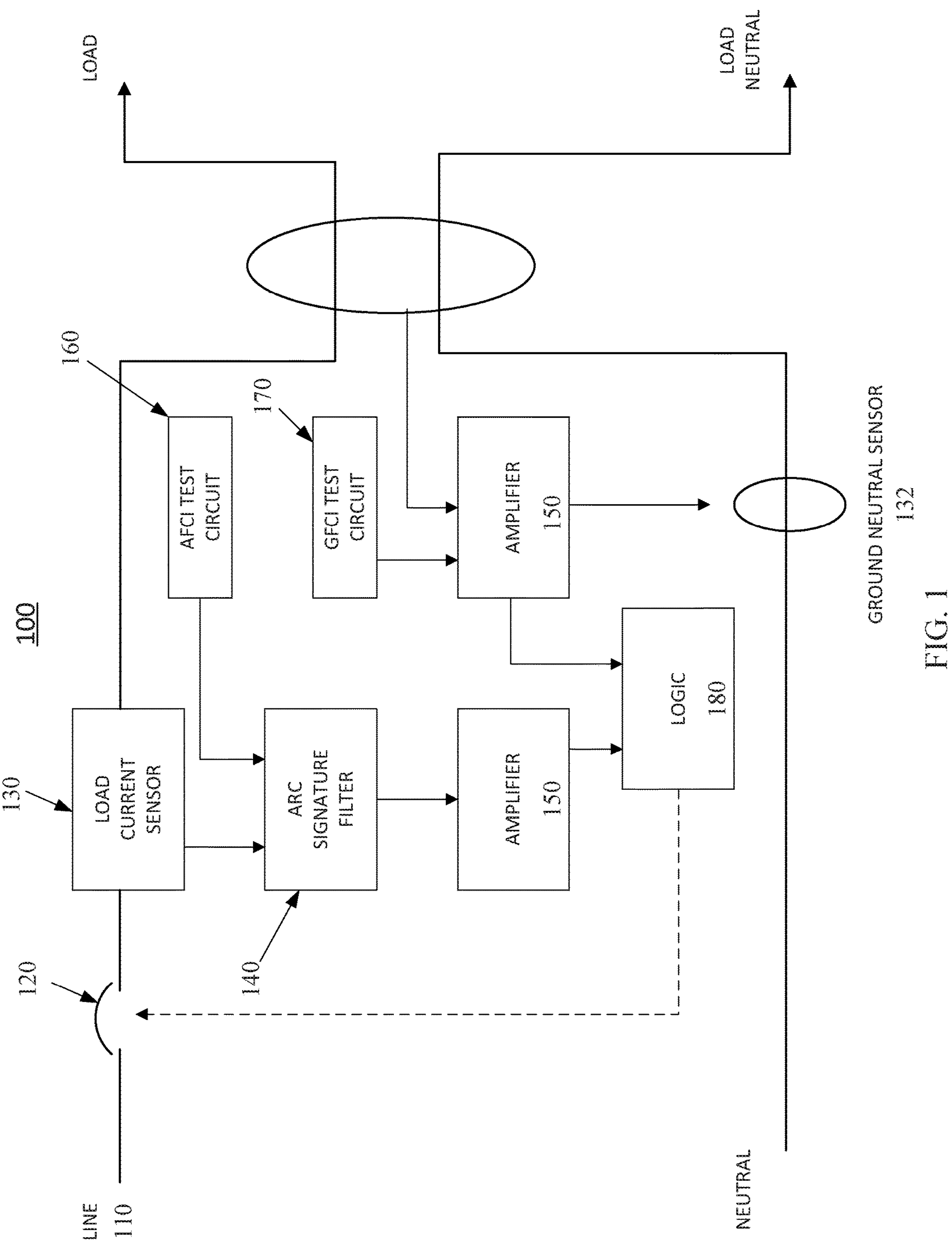
FIG. 1 illustrates an existing combined arc fault circuit interrupter (AFCI) system.
Figure 2:
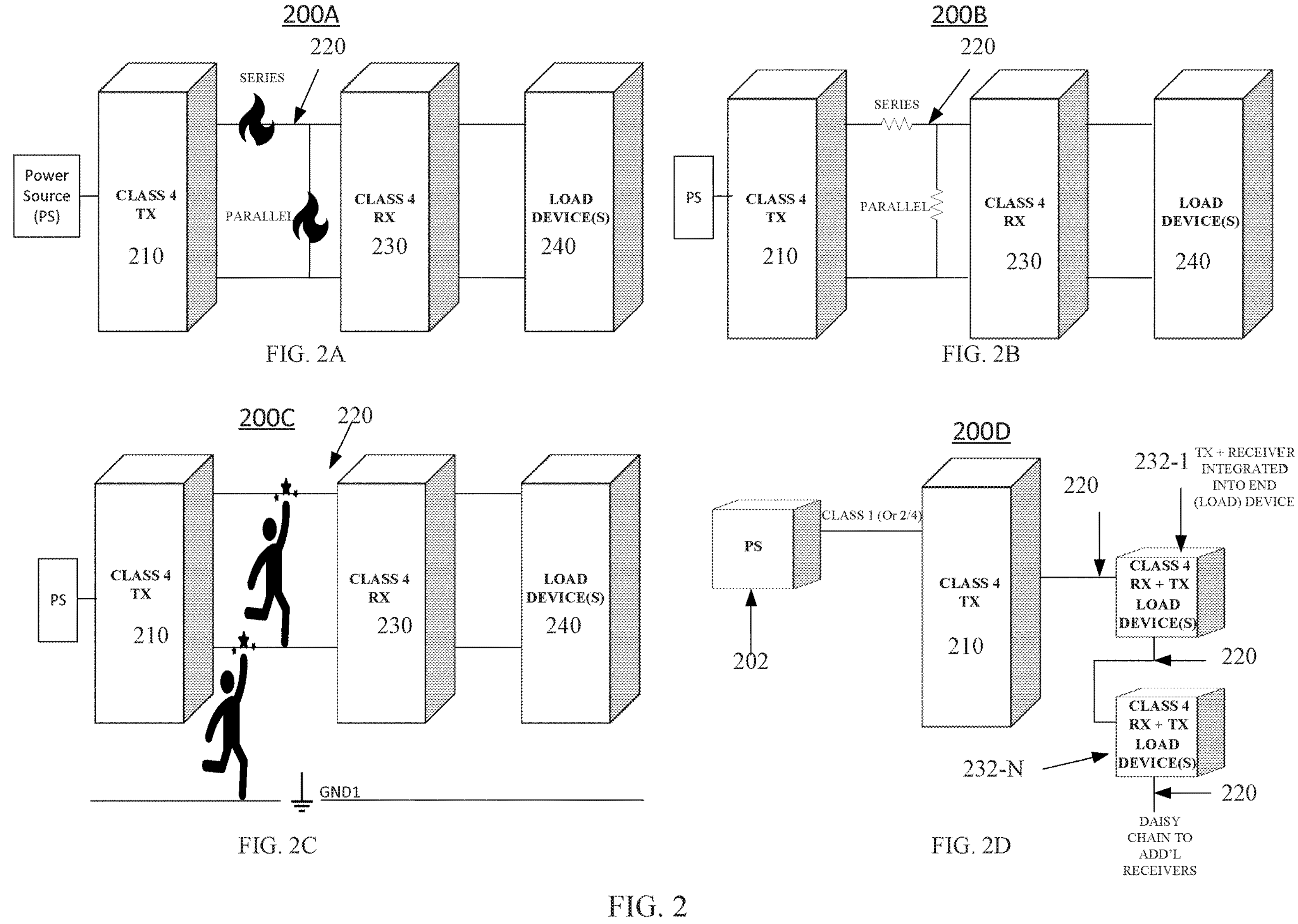
FIGS. 2A-2C illustrate existing example fault management systems.
FIG. 2D illustrates an example daisy chain power system according to embodiments of the present disclosure.

The present disclosure is not limited in its application to the details of construction and the arrangement of components set forth in the following description or illustrated in the drawings. The examples described herein may be capable of other embodiments and of being practiced or being carried out in various ways. Also, it may be appreciated that the phraseology and terminology used herein is for the purpose of description and should not be regarded as limiting as such may be understood by one of skill in the art. Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive. The present disclosure also can be used with devices other than lighting devices in the same space with similar benefits.

Definitions

Daisy-chain wiring: in & out separate, meant as: wired from one fixture to next. Galvanically parallel connected (T tab connector): in & out connection(s) galvanically connected, specifically allowing star and or tree runs, for example the "wire it up any way" according to the some standards. Power supply (PS), alternating current (AC) or direct current (DC), conditions input power/V/I to an output power/V/I, Fault Management Protection System (FMPS), TX=Transmitter of power, a power output that can implement different levels of fault-management: limited (e.g., a standard power supply), fire, and (optionally) shock safety-loop closed with 1 or more RX (mRX). RX=Receiver of power, capable of implementing different levels of fault-management: limited (e.g., standard LED driver w/o FMPS class), fire, and (optionally) shock safety-loop closed with 1 or more TX (mTX). PoL=Point of Load corresponds to devices that create V/I from the class 4/2 connections toward the end device which could be an LED driver (current or voltage sources) or USB-C sockets, etc. Low voltage DC: less than 60V, high voltage DC: above 60V. IEC's SELV=Safety Extra Low Voltage. GFCI=Ground Fault Circuit Interrupter. AFCI/AFDD=Arc Fault Circuit Interrupter (or Arc Fault Detection Devices).

Embodiments described herein provide a new fault management system incorporating related safety-standard developments which have enabled DC and AC cabling without using conduit exceeding 60V (relating to shock safety needs), as well as exceeding 100 W (US class 2, relating to fire safety needs). Therefore, embodiments described herein result in conduit free installation allowing lower component and installation labor costs, while also allowing higher voltages and much higher power transfer and/or range related to wire gauge.

Embodiments described herein facilitate electrical power transfer throughout various configurations of National Electrical Code (NEC) circuit classifications (e.g., class 1, class 2, class 3, and class 4). For example, NEC class 1 (CL1) is divided into remote-control/signaling circuits and power-limited circuits, wherein remote-control and signaling circuits shall not exceed 600V; and power-limited circuits operate at no more than 30V and 100 VA with limited source output. Further, power-limited circuits also restrict the amount of supply current on the circuit in the event of a ground fault, short circuit, or overload. NEC class 2 (CL2) can support lower power (up to 100 VA) in various environments and considers safety from a fire initiation perspective and provides sufficient protections from electrical shock. CL2 power loads are often delivered through Power over Ethernet (PoE) cables, which combine power and data in a single cable run, saving material and labor costs. NEC class 3 (CL3) are similar to CL2 circuits but with increased power and voltage capacities, but they also support low-energy, low-voltage applications, albeit less common. NEC class 4 (CL4) support voltages up to 450V DC, and AC up to +/−225V, in a fault-managed environment and provide the convenience and safety of low-voltage power (similar to PoE), but also offers about 20 times the power of PoE across hundreds of meters, thus providing a safe alternative to AC power. In other words, CL4 power systems enable DC power at higher voltages and are safer than traditional AC electrical systems by virtually eliminating the risk of electrical shock or fire.

As a background on safety functions and related circuits, there are six example use cases that can be handled with P>100 W and V>60V, wherein the shock cases can be dropped for use cases when V<60V. For example, if the hazard=shock; and fault type=line-to-Earth, then the GFCI, AFCI and FMPS safety functions may be implemented. Further, if the hazard=shock; and fault type=line-to-line, then only the FMPS as safety a function may be implemented. Further, for example, if the hazard is fire and the fault type is series arc, then the AFCI and FMPS safety functions may be implemented. Furthermore, if the hazard is fire and the fault type is parallel arc, then the AFCI and FMPS safety functions may be implemented. Even further, if the hazard is fire and the fault type is line-to-line (resistive or series resistive), then only the FMPS safety functions may be implemented.

Embodiments of the invention described herein are configured to apply FMPS safety measures effective in lighting and related spaces devices (i.e., plug power devices such as USB-C) space, especially in roughly the last 30 m/100 ft of cabling where many point-of-loads devices are distributed. Currently in class 1 conduit-based systems, the combination of "free style" daisy-chain and tree/branch wiring is preferred rather than hub and spoke wiring. For example, class 2 (e.g., PoE) or class 4 (e.g., FMPS TX/RX) configurations cater to hub and spoke wiring with high cost and complex TX/RX implementations.

Further, embodiments described herein are configured to improve energy efficiency, standby performance, reduced and simplified wiring, reduced product portfolio complexity, size, and cost improvements by the below described methods. For example, FMPS systems include control and feedback components to determine (using an Arc Profile Detection Filter) if arcing is happening based on voltage and current sense inputs. Responsive to detecting a fault condition (e.g., determining that arcing is happening), the FMPS control component may be configured to drive the interrupter switch off, disabling the power to the transmitter component. Embodiments described herein provide for at least one arc detector on each galvanic line. However, additional detection circuits (e.g., both on TX and RX) provide an improved system with potentially more robustness on false positives or, the opposite, unflagged events.

For example, an FMPS' TX circuit implementing V>60V and P>100 W monitors power with an accuracy of 100 W/100 ms and monitors current with an accuracy of 10 mA/3 ms. For example, when V<60V, the FMPS, as described herein, eliminates the need for shock fault protection circuitry and current accuracy due to the lower voltage class, but the full power carrying interrupter switch is still needed in case of an unexpected fault.

To provide context for the improvements within this technological field, FIGS. 1-5 provide some background information of the state of art and difficulties experienced therein.

FIG. 1 illustrates a combined arc fault circuit interrupter (AFCI) system 100, in accordance with an embodiment of the present disclosure.

Referring to FIG. 1, system 100 illustrates an example functional diagram of combined (i.e., added ground fault protection) AFCI. For example, system 100 includes switch 120 configured to receive line voltage 110 and facilitate line voltage 110 to load current sensor 130 to determine the load current at that node. System 100 further includes arc signature filter 140 configured to receive data from load current sensor 130 and AFCI test circuit 160 for amplification by amplifier 150 so that logic 180 can determine if a fault condition exists at the load. Furthermore, system 100 includes GFCI test circuit 170 configured to receive ground fault data for amplification by amplifier 150 so that logic 180 can further determine if a fault condition exists relative to ground. System 100 also includes ground neutral sensor 132 configured to detect ground fault data for amplification to assist in determining the presence of a fault condition.

System 100 may be configured to perform trip timing to trip the circuit using switch 120 in the case of a detected fault condition within a certain timing pattern. For example, a typical trip timing (e.g., maximum tripping time for AFDDs $U_N$=230V and 400V for an arc is as follows: test arc current (effective value) −2.5 A, 5 A, 10A, 16 A, 32 A, and 63 A, wherein the maximum operating time, respectively is 1 s, 0.5 s, 0.25 s, 0.15 s, 0.12 s, and 0.12 s. However, while the combined AFCI described in system 100 accounts for three of the six fault cases, an FMPS system, as described below herein, implements all six cases in case of V>60V and P>100 W, resulting in an improved fault management and protection scheme.

As illustrated in FIG. 1, system 100 performs ground fault detection that is needed when V>60 V and utilizes an inductive coil to detect the delta current between the two lines (e.g., load and load neutral) where the protection circuit turns off. Further, in addition to the combined AFCI, the FMPS, as described below herein, used at V>60V should account for "lost" current (between power TX and power RX device or mRX devices) of line-to-line shock with a performance that should account for 10 mA at 3 ms.

FIGS. 2A-2C illustrate example transmitter to receiver fault condition management systems 200A-200B.

Embodiments described herein include systems 200A-200D configured to implement safety features along three axes, each with two types. For example, referring to FIG. 2A, system 200A may include class 4 TX 210 connected via line 220 in series or parallel with class 4 RX 230 that is connected to load device(s) 240. System 200A may experience faults corresponding to sustained power losses on consistent arcs (especially due to high voltage DC) and includes two types: (1) line to line arcing and (2) in-line power losses, which can cause fire when P is greater than 100 W and over 100 ms duration. Class 4 power can support AC and DC similarly.

Further, referring to FIG. 2B, system 200B may experience resistive faults on line 220 corresponding to sustained losses on resistance, and includes two types: (1) line to line and (2) in-line power losses which can cause fire when P is greater than 100 W and over 100 ms duration.

Furthermore, referring to FIG. 2C, system 200C may experience faults corresponding to human body and current leakage and includes two types: (1) line to line arcing and (2) line to earth (or ground) power losses, which can cause shock when V is greater than 60V and longer than 1-3 ms.

According to embodiments of the present disclosure, and referring to FIG. 2D, system 200D may include power source (PS) to class 4 TX 210 via a class 4 circuit, wherein class 4 RX load device(s) corresponds to a receiver RX 232-1 integrated into an end (load) device that may be daisy-chained to additional receivers (e.g., RX 232-2, . . . RX 232-N).

Figures 3A, 3B:
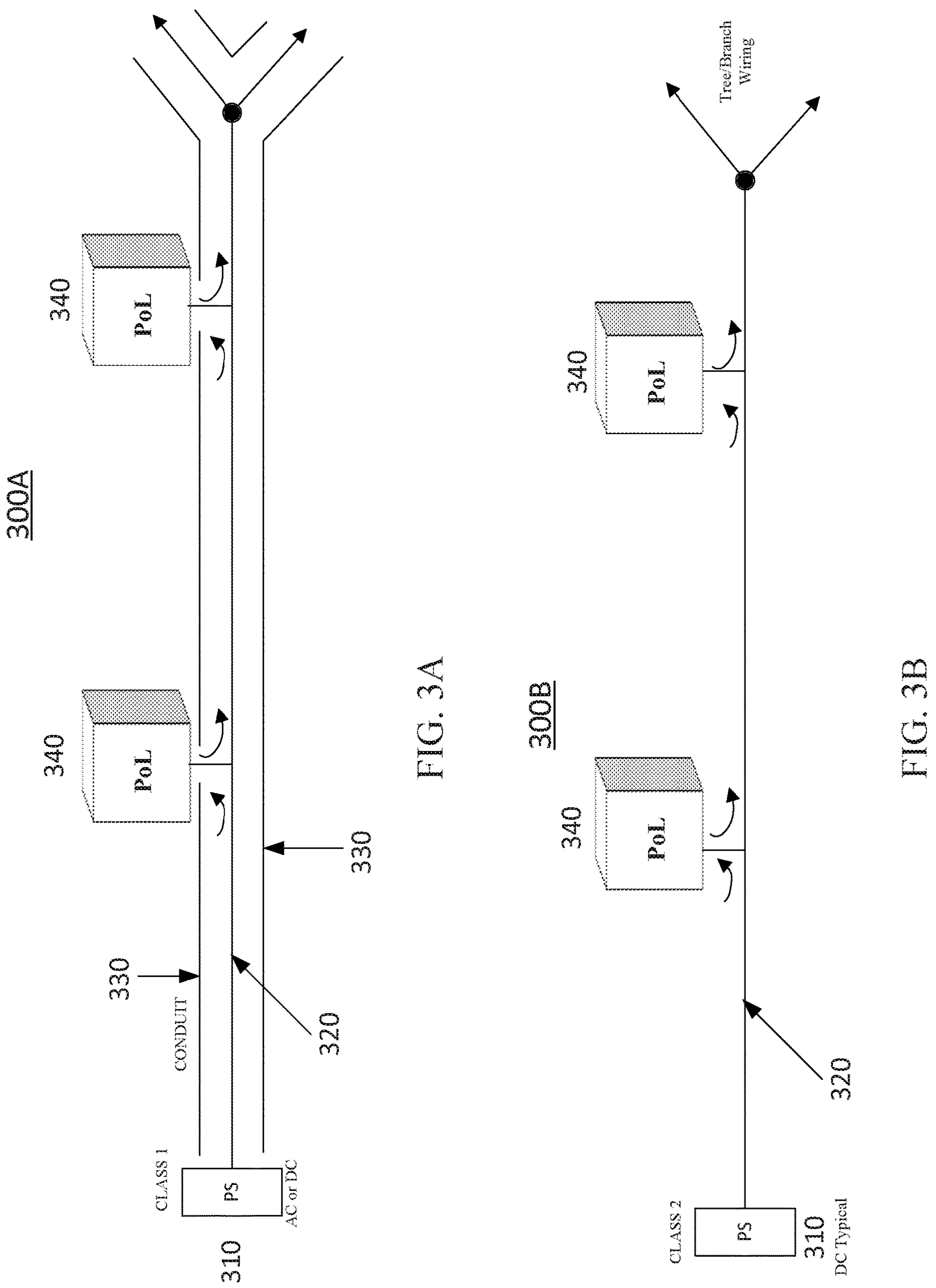
FIGS. 3A-3B illustrate example a typical existing transmitter to receivers cabling lighting systems.

FIGS. 3A-3B illustrate traditional examples of transmitter to receiver cabling for a lighting systems 300A-300B.

Referring to FIG. 3A, system 300A may include a traditional AC 120/277V transmitter 310 configured with class 1 cabling 320 within conduit 330, wherein the system 300A components may be daisy-chain wired, parallel wired, and/or other wiring configurations facilitating connections to one or more receiving PoLs 340.

Referring to FIG. 3B, system 300B may include a traditional AC 120/277V transmitter 310 providing power to class 2 cabling 320 with no conduit in the limited use case of 100 W and 60V with connections to one or more receiving PoLs 340.

Figures 4, 4A, 4B:
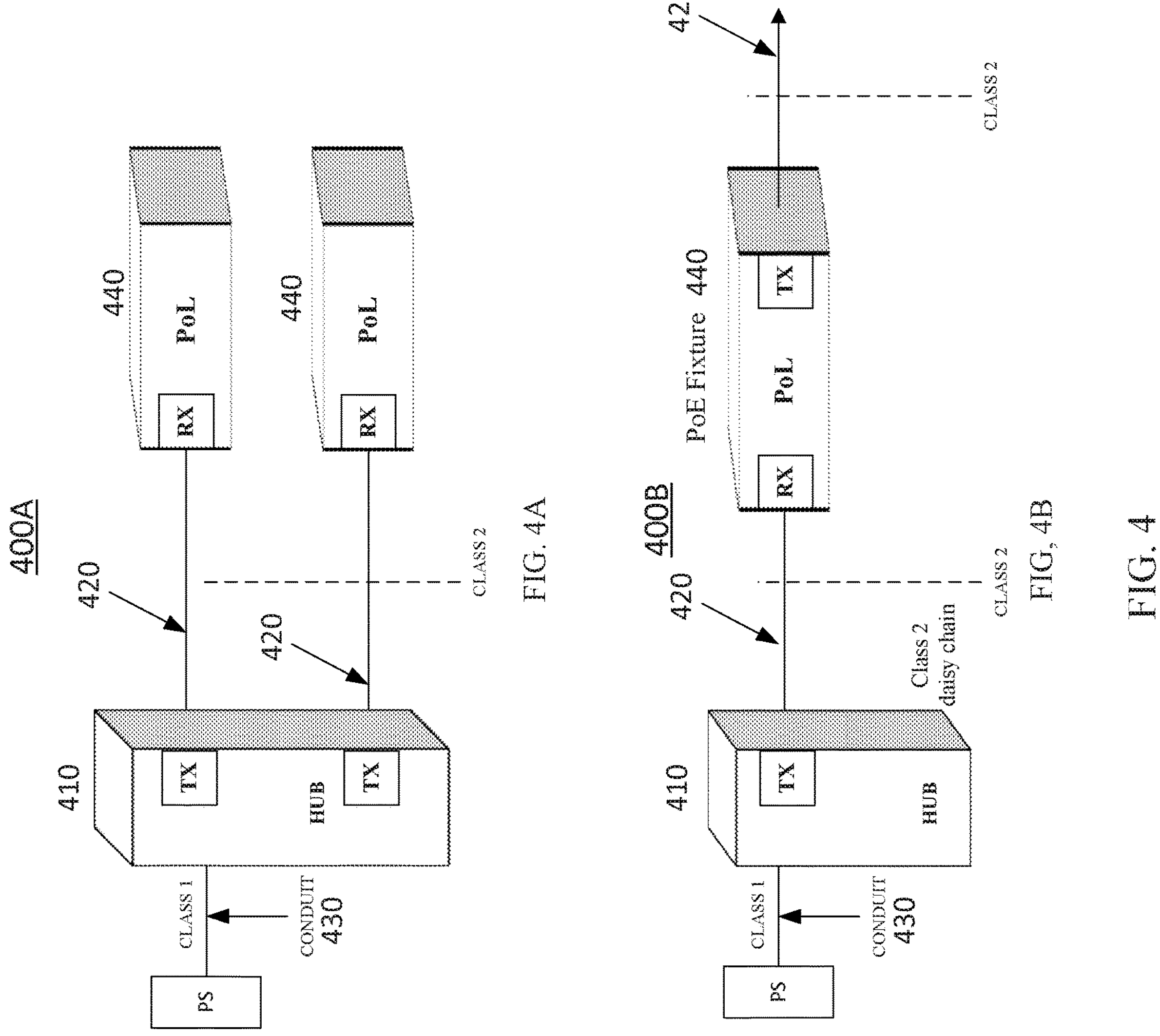
FIG. 4A illustrates example of existing hub and spoke cabling lighting systems.
FIG. 4B illustrates a daisy chain approach according to one embodiment of the present disclosure.
Figure 5:
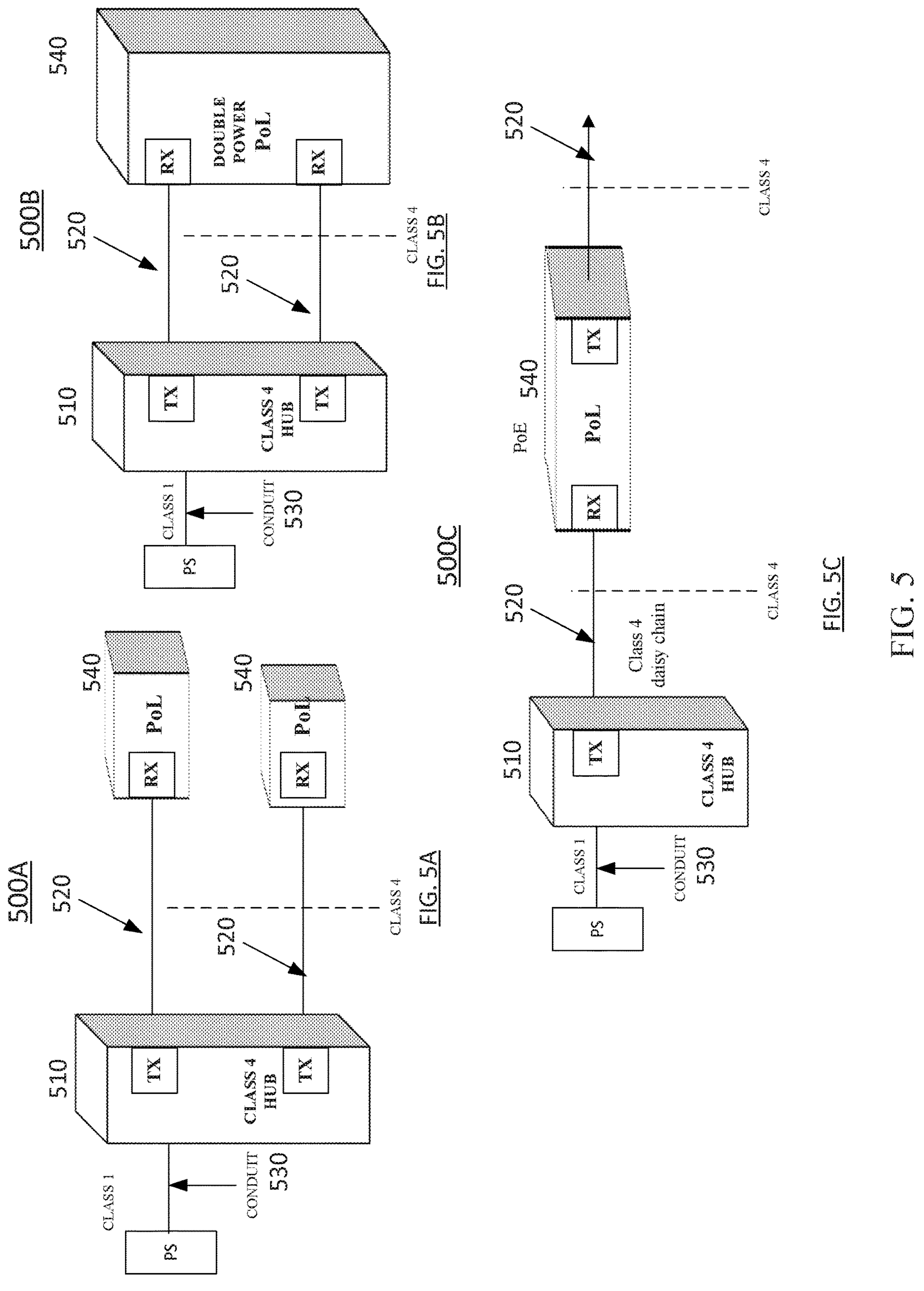
FIGS. 5A-5B illustrate examples of existing hub and spoke conduit-free systems.
FIG. 5C illustrates a daisy chain approach according to one embodiments of the present disclosure.

FIG. 4A illustrates example hub and spoke cabling for lighting systems 400A.

System 400A may include transmitting device(s) 410 and receiving device(s) 440 connected in a hub and spoke network configuration, wherein each transmitting device(s) 410 is connected to each receiving device(s) 440 via a line 420 connection to a hub, wherein the hub may include the transmitting device 410. In other words, the hub and spoke network connects every receiver through a single intermediary location called a hub (e.g., transmitting device).

Referring to FIG. 4A, system 400A may include transmitting device 410 including a power source and hub configured to facilitate power transfer from a class 1 line insulated by conduit 430 to one or more receiving device(s) 440 via a class 2 line 420. For example, transmitting device 410 may include multiple transmit out ports configured to establish a connection to one or more receiving device 440 in ports via line 420. Further, line 420 may be configured as class 2 power, thus not requiring insulated conduit as class 1 power would.

Referring to FIG. 4B, system 400B may include transmitting device 410 including a power source and hub configured to facilitate power transfer from a class 1 line insulated by conduit 430 to a single PoL (e.g., PoE fixture) 440 having both a receiving component RX and a transmitting component TX incorporated therein. For example, transmitting device 410 may include a single transmit out port TX configured to establish a connection to a single PoL 440 having a receiving device in port via a class 2 line 420, which is connected to a transmitting device for connecting to an external device via a class 2 line out.

As described herein, various Power over Ethernet (PoE) networks or similar DC systems may be incorporated within a hub and spoke network without the need to use conduit insulation due to the low voltages compatible in class 2 PoE connections, thus also not requiring daisy chain nor parallel wiring (point to point).

FIGS. 5A-5B illustrate examples of various conduitless hub and spoke systems 500A-500B. FIG. 5C shows the invention of the daisy-chain approach.

Referring to FIG. 5A, system 500A may include transmitting device 510 including a power source and class 4 hub configured to facilitate power transfer from a class 1 line insulated by conduit 530 to one or more receiving device(s) 540 via a class 4 line 520. For example, transmitting device 510 may include multiple transmit out ports TX configured to establish a connection to input ports of one or more receiving devices 540 via class 4 line 520. Further, line 520 may be configured as class 4 power, thus not requiring insulated conduit as class 1 power would.

Referring to FIG. 5B, system 500B may include transmitting device 510 including a power source and class 4 hub configured to facilitate power transfer from a class 1 line insulated by conduit 530 to a single receiving device 540 (e.g., double power PoL) including multiple receiving components RX via a class 4 lines 520. For example, transmitting device 510 may include multiple transmit out ports TX configured to establish a connection to receiving device 540 to each of receiving components RX in ports via both class 4 lines 520.

Referring to FIG. 5C, according to embodiments of the present disclosure, system 500C may include transmitting device 510 including a power source and class 4 hub configured to facilitate power transfer from a class 1 line insulated by conduit 530 to a single PoL (e.g., PoE fixture) 540 having both a receiving component RX and a transmitting component TX incorporated therein. For example, transmitting device 510 may include a single transmit out port TX configured to establish a connection to a single PoL 540 having a receiving device RX in port via a class 4 daisy chain line 520, wherein the receiving device RX may be connected to a built-in transmitting device TX for connecting to an external device via a class 4 line out.

The illustrated hub and spoke systems (e.g., 500A-500C) are configured to support a single TX connected to a single RX plus multi-TX to a single RX. For example, hub and spoke systems may include DC/AC hub and spoke without conduit, daisy-chained DC/AC hub and spoke, and DC/AC hub and spoke with a multi-TX connected to a single RX. Therefore, when implementing hub and spoke networks within large infrastructure commercial lighting systems, great advantages may be realized by removing the need for conduit insulated electrical connections or cabling.

Furthermore, when implementing the TX and RX in the hub & spoke and daisy chain designs, additional components will be necessary for successful implementation, increasing costs significantly (e.g., fine-grained grid distribution of point-of-load LED driver power supplies of the last 30-200 ft of cable in commercial, hospital, or industrial buildings, etc.). For example, costs are increased because preferred cabling designs for lighting installations must be implemented from one fixture to the next. Thus, if the cabling design is simplified, preferably by free style tree & branching of single pair galvanic lines, the installation will result in lower material and labor costs. Even further, implementing both incoming RX and outgoing TX circuitry in each fixture leads to additional pass-through and standby losses and the size and cost of components will increase, especially when node (fixture) count is high relative to low power usage and small load size (e.g., LED lights). Therefore, embodiments described herein significantly reduce the complexity and overhead of the FMPS for lighting applications towards the last 30-200 ft of cable.

Figure 6:
FIG. 6 illustrates an example of a single transmitter to multi receiver power management system, in accordance with an embodiment of the present disclosure.
Figure 6:
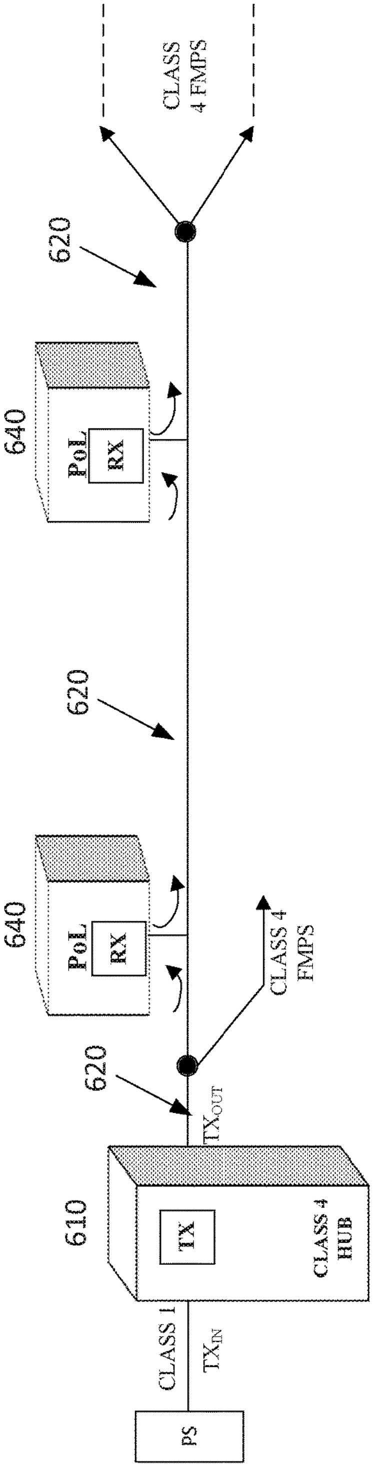

Nonetheless, embodiments described herein improve the daisy chain hub and spoke configuration by implementing a multi-RX approach connected to a single TX, as illustrated in FIG. 6.

FIG. 6 illustrates an example of a single transmitter to multi receiver system 600 within an FMPS, in accordance with an embodiment of the present disclosure.

Single transmitter to multi receiver system 600 may include a transmitting device 610 having a transmitter input (e.g., class 1 line power source) $TX_{IN}$ and a transmitter output (e.g., class 4 line voltage) $TX_{OUT}$ configured to provide electrical power to point-of-load (PoL) receiving devices 640 RX via low ohmic or galvanic line within the downstream electrical network corresponding to class 4 FMPS. For example, system 600 may also include a low-galvanic or low ohmic conductive line 620 (not interrupted by circuits in each 640, meaning a low impedance connection between input and output going class 4 galvanic lines) between transmitting device 610 and receiving device(s) 640, wherein line 620 is configured to facilitate electrical power transfer between the transmitting device 610 and the receiving devices 640. In an embodiment, transmitting device 610 may correspond to a hub component including a transmitter that may be compliant with various NEC (national electric code) circuit classifications (e.g., class 1, class 2, class 3, class 4).

System 600 may include additional TX hardware and functions per each node, while the cabling can be daisy-chained and parallel connected, thereby reducing power losses on efficiency and standby, while supporting P>100 W and V>60V without conduit. In this embodiment, the safety functions related to fire (e.g., resulting from power loss) and shock (e.g., resulting from current loss) may be implemented on the "instantaneous" power and current sums of each of the receivers versus what was transmitted. For example, system 600 may be configured to synchronize the measurements of TX and RX sufficiently to protect against fire and shock. Further, as an added benefit, the circuitry needs for RX and mRX are similar, resulting in significant savings from additional costs and network size.

Additionally, another technical benefit of the embodiments described herein is that system 600 may be configured to use LV DC rather than HV DC for the last 30-100 ft runs in a building. For example, shock related fault management methods and systems are not needed (due to the lower voltages), thereby simplifying the circuitry and communication latency demands between TX and (m)RX.

Figures 7A, 7B:
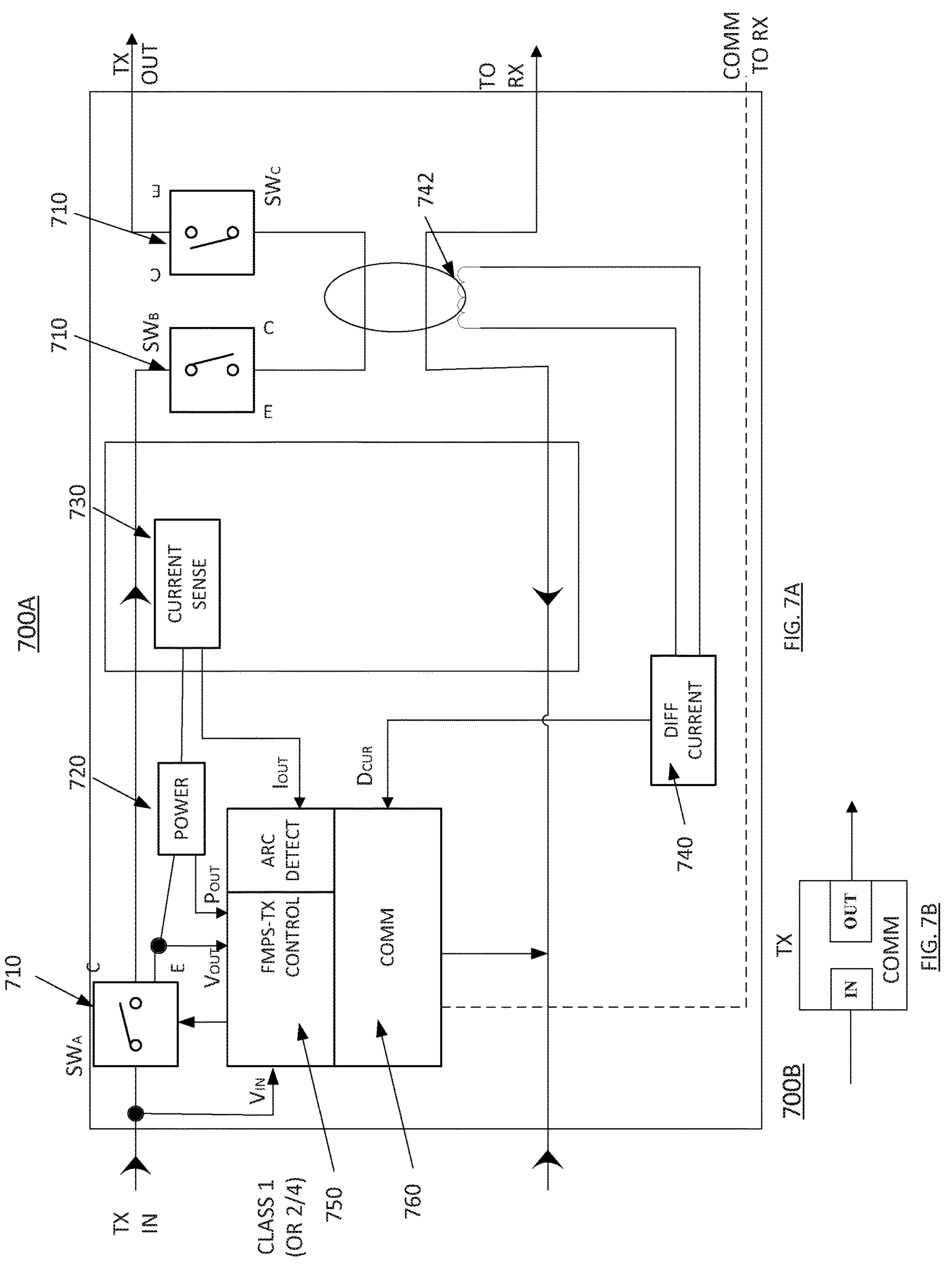
FIGS. 7A-7B illustrates examples of existing transmitter components within a FMPS.

FIGS. 7A-7B illustrate an example transmitter 700A-700B component within an FMPS.

Transmitter 700A component is shown as a detailed version of transmitter 700B component shown as a simplified transmitter 700B component. An example embodiment of transmitter 700A component may include one or more switches 710 (e.g., TX's interrupter switch $SW_A$, $SW_B$, $SW_C$, where only one of these switches may be needed for a given implementation) positioned between $TX_{IN}$ and $T_{XOUT}$ configured to interrupt power flow through transmitter 700A component. Each switch 710 may be configured to be connected to FMPS-TX control 750 to receive instructions for transitioning from an open state to a closed state, and vice versa. For example, responsive to receiving an instruction to disrupt the circuit, switch 710 $SW_A$ may be configured to toggle or transition from a closed state to an open state. Once switch 710 $SW_{A\ or\ B}$ or c is open, no power may be conducted from that point on through $TX_{OUT}$.

Transmitter 700A component may include power 720 component configured to determine a power measurement flowing through the circuit and transmit power data to FMPS-TX control 750 for monitoring, managing, and protecting the circuit from detected fault conditions.

Transmitter 700A component may include current sense 730 component configured to determine a current measurement flowing through the circuit and transmit current sense data to FMPS-TX control 750 for monitoring, managing, and protecting the circuit from detected fault conditions.

Transmitter 700A component may include differential current 740 component configured to receive current differential data from inductive or coil 742 component to determine a current difference measurement between $TX_{OUT}$ and the line out to RX. Differential current 740 component may also be configured to transmit the current differential data to FMPS-TX control 750 for monitoring, managing, and protecting the circuit from detected fault condition such as a line to earth fault.

Transmitter 700A component may include FMPS-TX control 750 configured to facilitate control of the one or more switches 710 to disrupt the power flow through transmitter 700A component if a fault condition is determined to exist within the FMPS network. For example, FMPS-TX control 750 may be configured to receive current, voltage, or power data from the corresponding components therein to determine if one or more of the measurements within the received data satisfies a condition (e.g., exceeds a threshold, for example, of power or current difference between TX and RX on either side of the class 4 line) for a fault condition. Responsive to determining that a fault condition exists, FMPS-TX control 750 may be configured to transmit an instruction (e.g., signal) to one or more of the switches 710 to interrupt the circuit, thereby terminating power flow through transmitter 700A component. Additionally, FMPS-TX control 750 may be configured to receive data from communications 760 component corresponding to detection of a fault condition (e.g., ground fault) detected further upstream in another larger electrical system and transmit a signal to interrupt the circuit using the one or more switches 710.

Transmitter 700A component may include communications 760 component configured to facilitate communications between components within transmitter 700A component and devices external to the same. For example, communications 760 component may be configured to receive input voltage data (e.g., $V_{IN}$), output voltage data (e.g., $V_{OUT}$), output power data (e.g., $P_{OUT}$), output current data (e.g., $I_{OUT}$), control data (e.g., data from FMPS-TX control 750), and receiving device data (e.g., RX data) from a receiving device external to transmitter 700A component to determine if a fault condition exists within the FMPS network, e.g., by matching power and current between RX and TX on either side of the class 4 line.

Referring to FIG. 7B, transmitter component 700B is illustrated as a simple version of transmitter 700A component, but with the same functionality.

Figure 7C:
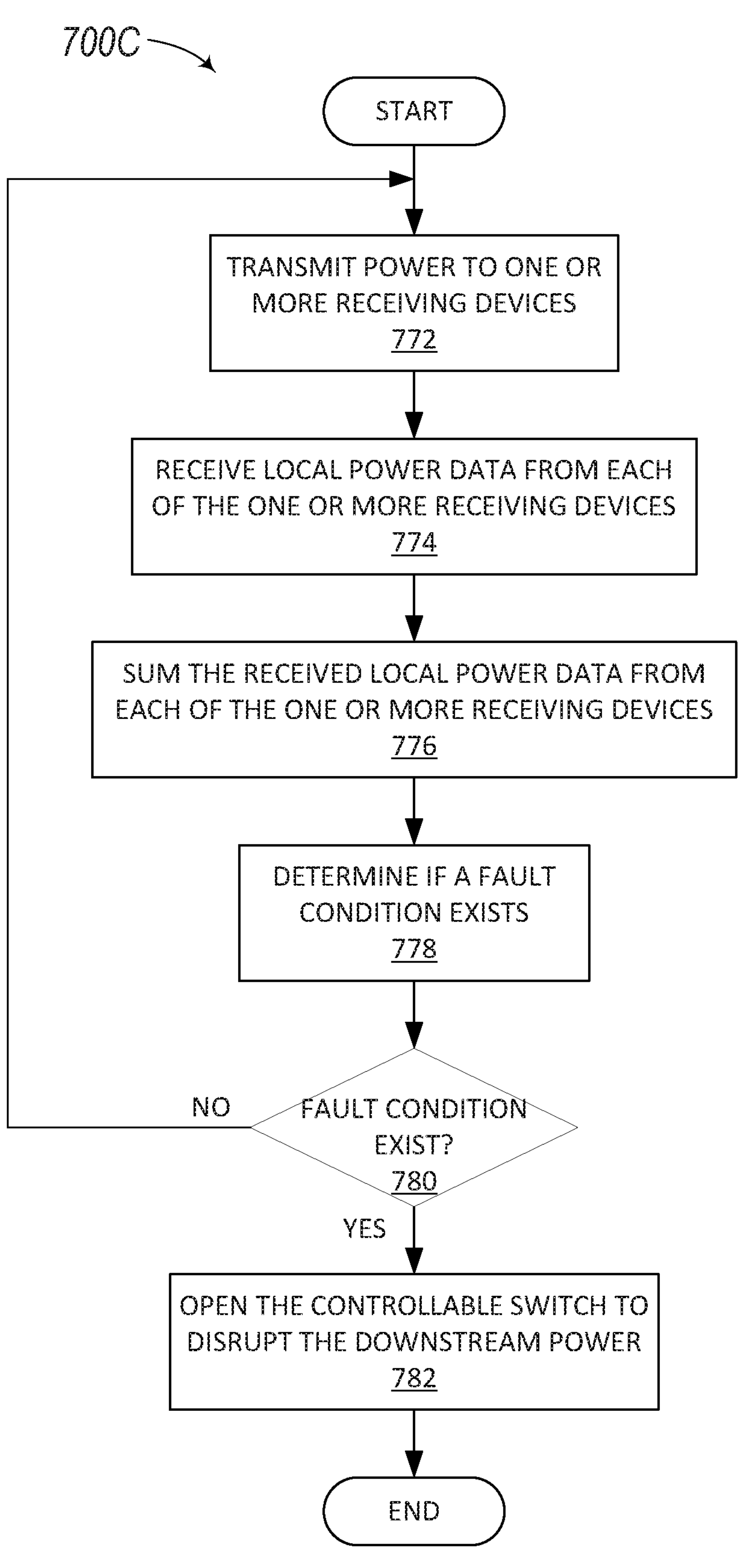
FIG. 7C is a flowchart diagram depicting the process for one example embodiment for transmitting power consistent with the present disclosure.

FIG. 7C is a flowchart diagram 700C depicting the process for one example embodiment for transmitting power consistent with the present disclosure. It should be appreciated that FIG. 7C provides only an illustration of one implementation and does not imply any limitations with regard to the environments in which different embodiments may be implemented. Many modifications to the depicted environment may be made by those skilled in the art without departing from the scope of the disclosure as recited by the claims.

The process includes transmitting power to one or more receiving devices (operation 772). In the illustrated example embodiment, a transmitting device generates power that is transmitted to one or more receiving devices.

The process also includes receiving local power data from each of the one or more receiving devices (operation 774). Responsive to receiving the power transmitted by the transmitting device, each receiving device may provide local power to a local load. Each receiving device communicates data indicative of the local power to the transmitting device.

The process also includes summing the received local power data from each of the one or more receiving devices (operation 776). Responsive to receiving the data indicative of the local power from each of the one or more receiving devices, the transmitting device sums the received local power to determine if a fault condition exists.

The process also includes determining if a fault condition exists (operation 778). The transmitting device compares the sum of the local power data from each receiving device to the output power of the transmitting device. In an embodiment, a fault condition may exist if the sum of the received local power exceeds the output power of the transmitting device by a predetermined threshold. In one example embodiment, the TX device may comply with Underwriters Laboratory (UL) Code 1400-1, Sections 6.1-4 (and/or previous and/or future versions of the UL standard related to fault management, and in such an embodiment the maximum power that can be delivered into series or parallel resistive fault is 100 Watts, measured after 5 seconds. Thus, a fault condition is true if: $Power\_transmitted - \Sigma Power\_receivers \geq 100$ W.

Of course, this example specifies power fault conditions. The aforementioned standard, and as described elsewhere in this disclosure, determining if a fault condition exists can include, for example, determining an arc-fault condition (e.g., 300 Joules at 2.5 seconds), ground leakage condition (e.g., 30 mA DC within 5 s where the limit curve is provided by the aforementioned UL 1400-1 standard), electric shock condition (fault current and let-go voltage, e.g., 60 Vdc or 30 Vac_rms), an overvoltage condition (e.g., 450V maximum with a response <1 ms.), and/or an overcurrent condition, as may be specified by the aforementioned UL standard and/or as may be specified by a system manufacturer, etc.

Therefore, the process also includes determining if a fault condition exist (decision block 780). If it is determined a fault condition does exist ("yes" branch, decision block 780), then the process proceeds to operation 782. If it is determined that a fault condition does not exist ("no" branch, decision block 780), then the process returns to operation 772 to continue to transmit power.

The process also includes opening the controllable switch to disrupt the downstream power (operation 782). If it is determined a fault condition does exist, then the transmitting device will open the controllable switch to disconnect the output power, thereby preventing power from being transmitted to the one or more receiving devices.

Figure 8:
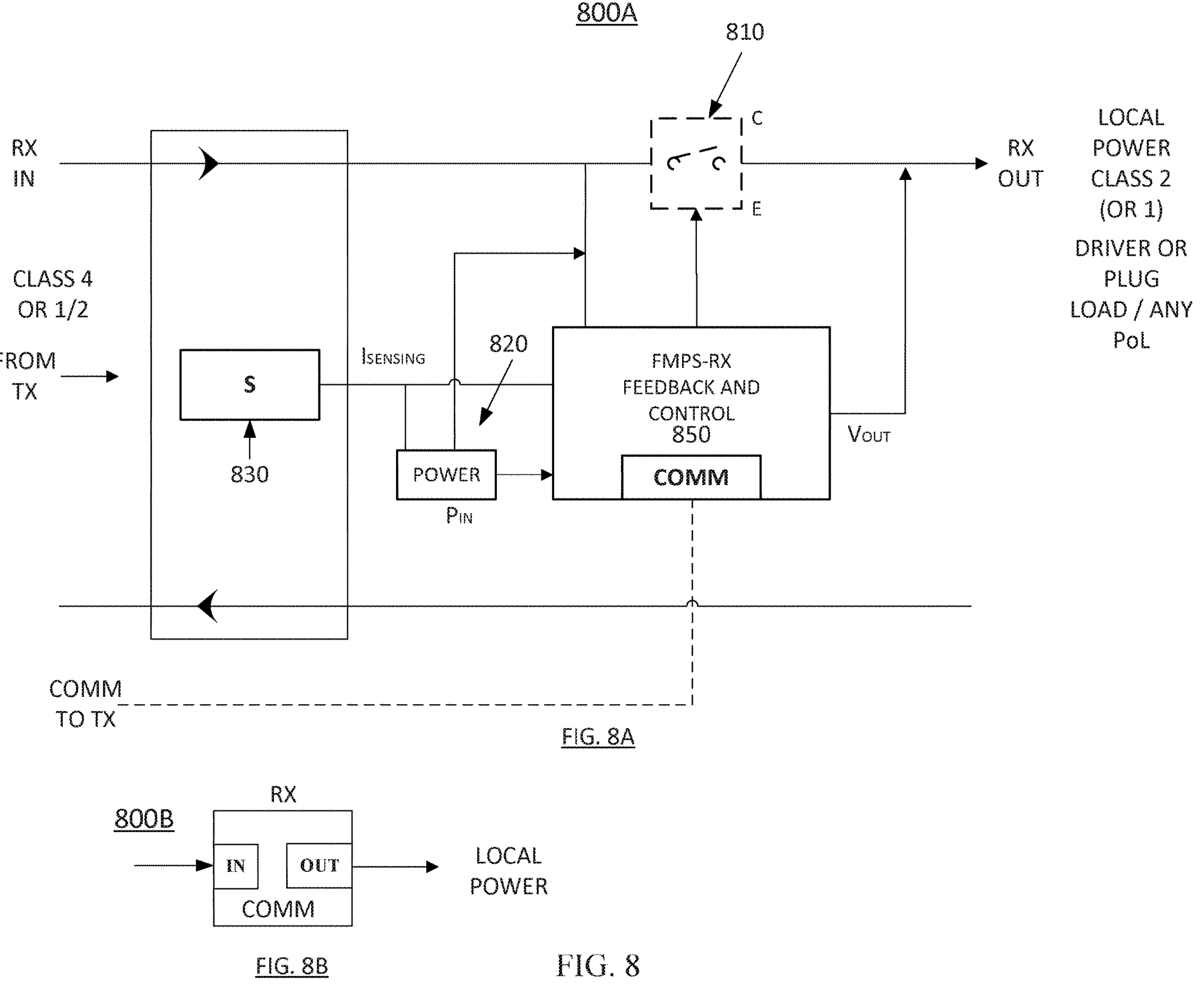
FIGS. 8A-8B illustrates examples of existing receiver components within a FMPS.

FIGS. 8A-8B illustrate an example receiver 800A/800B component within an existing FMPS.

The receiver 800A component is shown as a detailed version of the simplified receiver 800B component. The receiver 800A component may include optional switch 810 (e.g., RX's local load interrupter switch) positioned between $RX_{IN}$ and $RX_{OUT}$ configured to interrupt power flow through receiver 800A component. Optional switch 810 may be configured to be connected to FMPS-RX control 850 to receive instructions for transitioning from an open state to a closed state, and vice versa. For example, responsive to receiving an instruction to disrupt the circuit, optional switch 810 may be configured to toggle or transition from a closed state to an open state. Once optional switch 810 is open, no power may be conducted from that point on through $RX_{OUT}$.

The receiver 800A component may include power 820 component configured to determine a power measurement flowing through the circuit and transmit power data to FMPS-RX control 850 for monitoring, managing, and protecting the circuit from detected fault conditions.

The receiver 800A component may include current sensing 830 component configured to determine a current measurement flowing through the circuit and transmit current sense data to FMPS-RX control 850 for monitoring, managing, and protecting the circuit from detected fault conditions.

Receiver 800A component may include FMPS-RX control 850 configured to facilitate control of the optional switch 810 to disrupt power flow through receiver 800A component if a fault condition is determined to exist within the FMPS network. For example, FMPS-RX control 850 may be configured to receive current, voltage, or power data from the corresponding components therein to determine if one or more of the measurements within the received data satisfies a condition (e.g., exceeds a threshold) for a fault condition. Responsive to determining that a fault condition exists, FMPS-RX control 850 may be configured to transmit an instruction (e.g., signal) to optional switch 810 to interrupt the circuit, thereby terminating power flow through receiver 800A component. Further, FMPS-RX control 850 may be configured to generate feedback data based on the input data received and transmit the feedback data to transmitter 700A component via the communications medium. Additionally, FMPS-RX control 850 may be configured to receive data from communications component 760 of transmitter 700A component corresponding to detection of a fault condition (e.g., ground fault) detected between transmitter 700A component and receiver 800A component, or further upstream in another larger electrical system and transmit a signal to interrupt the circuit.

Receiver component 800A may include receiver communications component (COMM) configured to facilitate communications between components within receiver 800A component and devices external to the same. For example, receiver communications component may be configured to receive input voltage data (e.g., $V_{IN}$), output voltage data (e.g., $V_{OUT}$), output power data (e.g., $P_{OUT}$), output current data (e.g., $I_{OUT}$), control data (e.g., data from FMPS-RX control 850), transmitter device data (e.g., TX data) from a transmitter device external to receiver 800A component to determine if a fault condition exists within the FMPS network.

Referring to FIG. 8B, receiver 800B component is illustrated as a simple version of receiver 800A component, but with the same functionality.

Embodiments described herein further provide receiver component 800A corresponding to an FMPS state of the art (single) RX component, including an optional local power turn off optional switch 810 to provide system level benefits (e.g., fault recovery from a shorted local load). Optional switch 810 may be configured to support the max local power, but not the max pass-through power. In other example embodiments, trip curve coordinating may be critical between upstream and downstream protection. For example, the downstream receiver component should trigger first (but usually not nuisance trip), while the upstream receiver component may still need to respond fast enough to comply with the safety requirements on its own, if no measures are taken a daisy-chain might oscillate by cross-triggers even. An example embodiment of managing a controlled order of shutting down is by assigning a primary TX to RX-TX node distance daisy depth count number to each of the nodes in a daisy-chain such that shutting off on an event can be somewhat faster further downstream, e.g. by having Fault_Off_Delay=Fault_Off_Max−depth*Node_Fault_Delay_Delta.

Some FMPS implementations may only be configured for a single TX and single RX connected in a 1 to 1 implementation. For example, the communications between TX and RX may be used to convey current (e.g., shock V>60V) and power (e.g., fire P>100 W) accurately, fast, and reliably enough between TX and RX, such that fault response should be based on current and power measurements as may be specified above, and with a real time reliable system performance that falls within the aforementioned time constraints. Further, communication between TX and RX components may be conducted via wired and/or wireless mediums and systems as known to those of ordinary skill in the art.

Embodiments described herein may include UL class 4 implementations of FMPS pulsed (e.g., order of ms timing) systems for when power transfer methods are used for power-off times as a back-channel communication return channel. Other implementations may support a continuous current with back-channel communication methods. Embodiments described herein may be configured to implement both methods because the TX switch is the active element to perform the pulsing (or not), while the back-channel communication methods are part of the generic block "comms" where any wired/wireless or power-line wired method could be used to facilitate communication between TX and RX components.

Figure 9:
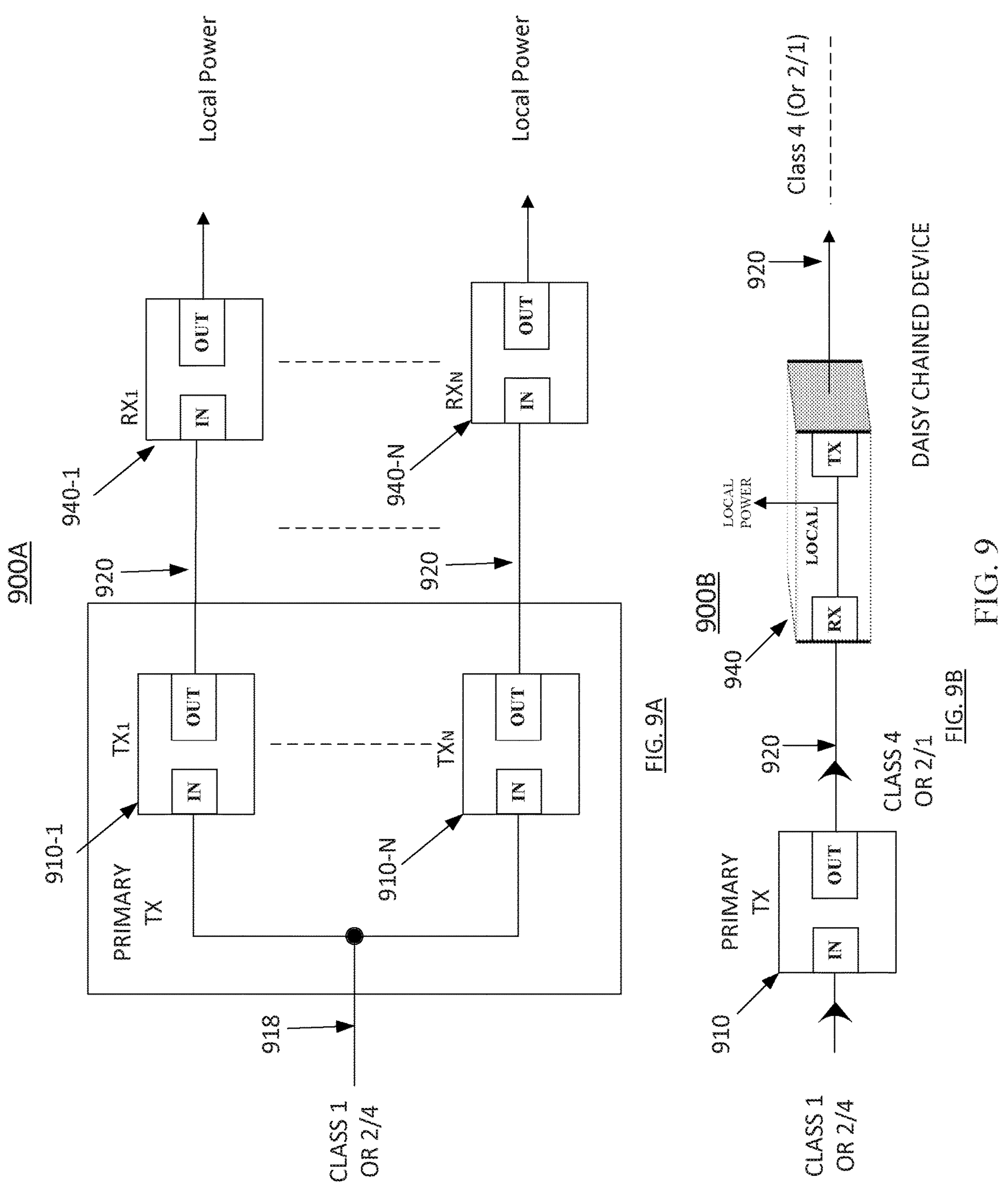
FIG. 9A illustrates a hub and spoke example of existing multi-transmitter multi-receiver for a FMPS.
FIG. 9B illustrates an example daisy chain approach according to an embodiment of the present disclosure.

FIG. 9A illustrates an example of a multi-transmitter multi-receiver 900A for an FMPS, and FIG. 9B is the daisy-chain approach 900B according to embodiments of the present disclosure.

Referring to FIG. 9A, system 900A may include one or more transmitting device(s) 910 (e.g., 910-1, . . . , 910-N) including a power source and class 1 (or 2/4) hub configured to facilitate power transfer from a class 1 (or 2/4) line 918 to one or more receiving device(s) 940 (e.g., 940-1, . . . , 940-N) via a class 4 (or 2/1) line 920. For example, transmitting device 910 may correspond to a primary transmitter TX and may include multiple transmit out ports TX (e.g., $TX_1OUT$, $TX_2OUT$, . . . , $TX_NOUT$) configured to establish a connection to one or more receiving device(s) 940 in ports RXIN (e.g., $RX_1IN$, $RX_2IN$, . . . , $RX_NIN$) via class 4 line 920. Further, line 920 may be configured as class 4 power, thus not requiring insulated conduit as class 1 power would. Each RXn provides local power to, for example, a lighting fixture.

Referring to FIG. 9B, system 900B may include primary transmitting device 910 configured to facilitate power transfer from a class 1 (or 2/4) line to a first class 4 PoL (e.g., local) 940 component having both a receiving component RX and a transmitting component TX incorporated therein. For example, transmitting device 910 may include a single transmit out port $TX_{OUT}$ configured to establish a connection to a first class 4 PoL 940 having a receiving device RX in port via a class 4 (or 2/1) daisy chain line 920, wherein the receiving device RX may be connected to a built-in transmitting device TX for connecting to a next external device daisy chained via a class 4 line out.

Embodiments of the invention herein further describe system 900A as a multi-transmitter multi-receiver network incorporating the hub & spoke configuration, as illustrated in FIG. 9A. For example, a multi-TX hub (e.g., primary TX 910-1) can consolidate some circuitry and full power passing switches optimized to lower power ratings per each TX. Further, the TX (i.e., transmitter) and RX (i.e., receiver) components may be implemented via daisy chain using another TX. However, this implementation may introduce additional complications corresponding to size and cost drawbacks. For example, each TX connected to the local RX should be able to pass the full power and current, but at a disadvantage for the cost and size of the switch and current and power measurement circuits.

Figure 10:
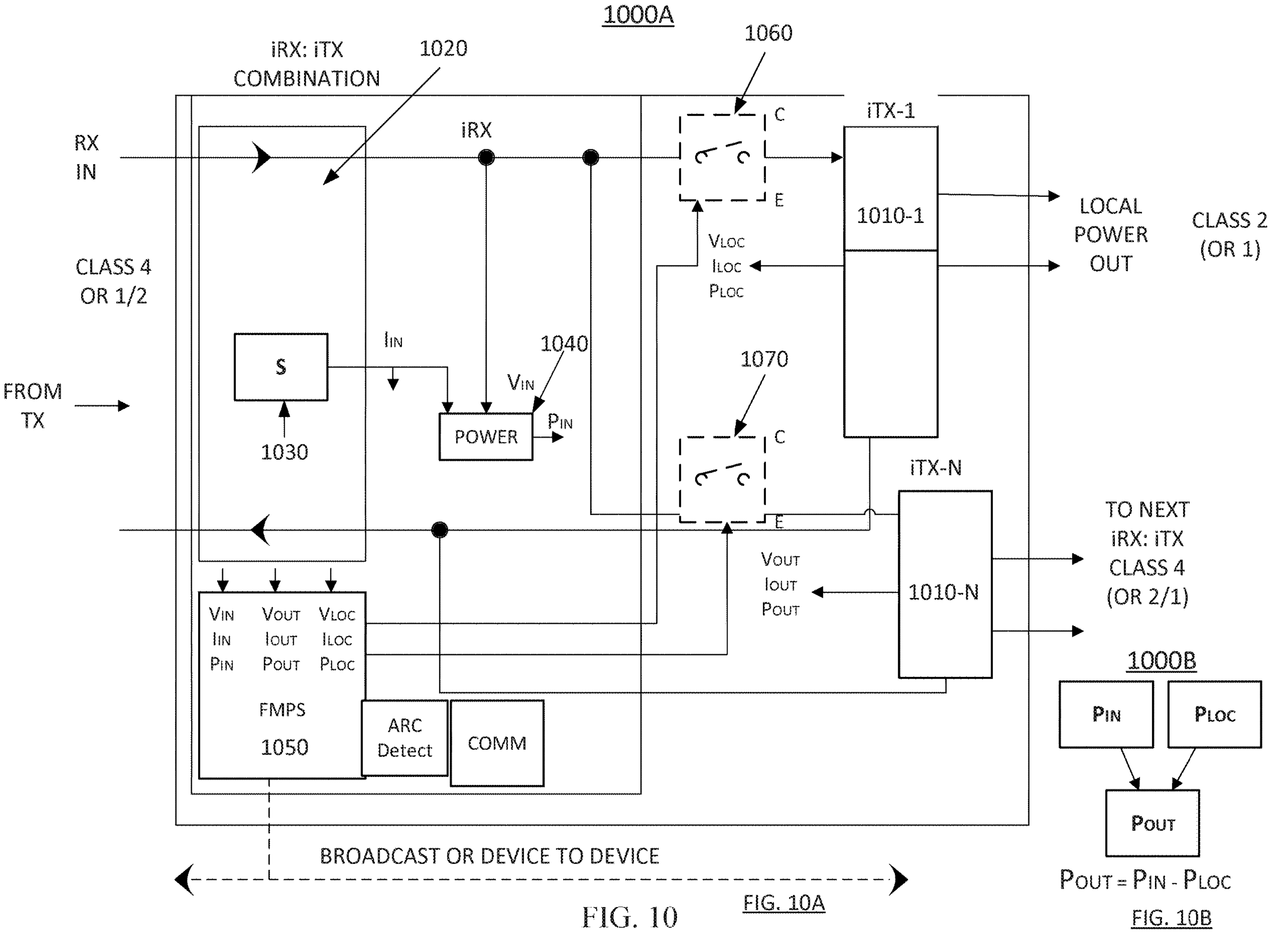
FIGS. 10A-10B illustrate examples of an in-line receiver to transmitter combination FMPS, in accordance with an embodiment of the present disclosure.

FIGS. 10A-10B illustrate an example in-line receiver to transmitter 1000A-1000B system, in accordance with an embodiment of the present disclosure.

Referring to FIG. 10A, system 1000A may include one or more inline transmitter(s) iTX-1 1010-1 through iTX-N 1010-N connected, as per FIG. 9B, to an inline receiver iRX 1020 having a current sense 1030 component integrated therein, wherein iRX 1020 is configured to receive class 4 (or ½) power as RX IN to system 1000A from an external transmitting TX device.

An example embodiment of system 1000A may include optional switch 1060 (e.g., iTX's interrupter switch) positioned between $iRX_{OUT}$ and $iTX_{IN}$ configured to interrupt local output power flow through receiver 1000A component. Switch 1060 may be configured to be in communication with FMPS control 1050 to receive instructions for transitioning from an open state to a closed state, and vice versa. For example, responsive to receiving an instruction to disrupt the circuit, switch 1060 may be configured to toggle or transition from a closed state to an open state. Once switch 1060 is open, no power may be conducted from that point on through $iTX\text{-}1_{OUT}$ local power out. Switch 1070 may be configured to be in communication with FMPS control 1050 to receive instructions for transitioning from an open state to a closed state, and vice versa. For example, responsive to receiving an instruction to disrupt the iTX output circuit to the next in the daisy-chaining, switch 1070 may be configured to toggle or transition from a closed state to an open state. Once switch 1070 is open, no power may be conducted from that point on through iTX daisy-chain power out. Switches 1060 and 1070 may serve to implement graceful degradation and diagnostics where, for example, in a daisy-chain there is a line-to-line short and be able to isolate that from the preceding part of the circuit. In addition, the 1070 can be used to implement an auto-addressing of devices in order of the daisy chain itself.

An example embodiment of receiver 1000A component may include power 1040 component configured to determine a power measurement flowing through the circuit and transmit power data to FMPS 1050 for monitoring, managing, and protecting the circuit from detected fault conditions. The receiver 1000A may include ARC detection circuitry, as described herein.

An example embodiment of system 1000A may include current sensing 1030 component configured to determine a current measurement flowing through the circuit and transmit current sense data to FMPS 1050 for monitoring, managing, and protecting the circuit from detected fault conditions.

System 1000A may include FMPS 1050 configured to facilitate control of the optional switch 1060 to disrupt power flow through receiver system 1000A if a fault condition is determined to exist within the FMPS network. For example, FMPS 1050 may be configured to receive current, voltage, or power data from the corresponding components therein to determine if one or more of the measurements within the received data satisfies a condition (e.g., exceeds a threshold) for a fault condition. Responsive to determining that a fault condition exists, FMPS 1050 may be configured to transmit an instruction (e.g., signal) to switch 1060 to interrupt the circuit, thereby terminating local output power flow through system 1000A.

System 1000A may include receiver communications component (COMM) configured to facilitate communications between components within system 1000A and devices external to the same.

Other embodiments described in FIG. 10A provide improved daisy chain wiring using FMPS TX with improved in-line iRX:iTX combinations with a fault-forwarding method. For example, a pass thru switch and some measurement circuits as shown in previous embodiments can be avoided by utilizing the primary-TX's (e.g., iTX-N 1010-N) output switch as the only interrupter for the entire daisy chain. This embodiment may be implemented by forwarding all daisy-chain stretches having iTX and connected iRX to detect a mismatch on power and/or current and feedback directly to the primary TX. For example, system 1000A may include a communication component configured to implement either broadcast or hop by hop communication schemes from one iTX-iRX connection, to the previous i(nline)TX-i(nline)RX connection, and next towards the primary TX.

While FIG. 10A shows $P_{IN}$, $I_{IN}$, $P_{OUT}$, $I_{OUT}$, and $P_{LOC}$, $I_{LOC}$ measurements, system 1000B as shown in FIG. 10B, is optimized to remove the $P_{OUT}$, $I_{OUT}$ as system inputs and use the relationship of $P_{OUT}=P_{IN}-P_{LOC}$, or even $P_{IN}=P_{OUT}+P_{LOC}$, removing the need for full power carrying $P_{OUT}$ or $P_{IN}$ circuitry, or $P_{LOC}=P_{IN}-P_{OUT}$ (although $P_{L}$OC is mostly lowest loss/size/cost to measure). As a safety concern, is important to note that local energy storage (e.g., capacitance) must be limited unless back-feeding of that local storage to the class 4 bus is prevented via a diode or switch. For example, too much local energy back feeding a bus could lead to more energy loss with respect to shock or fire hazards.

Figure 11A:
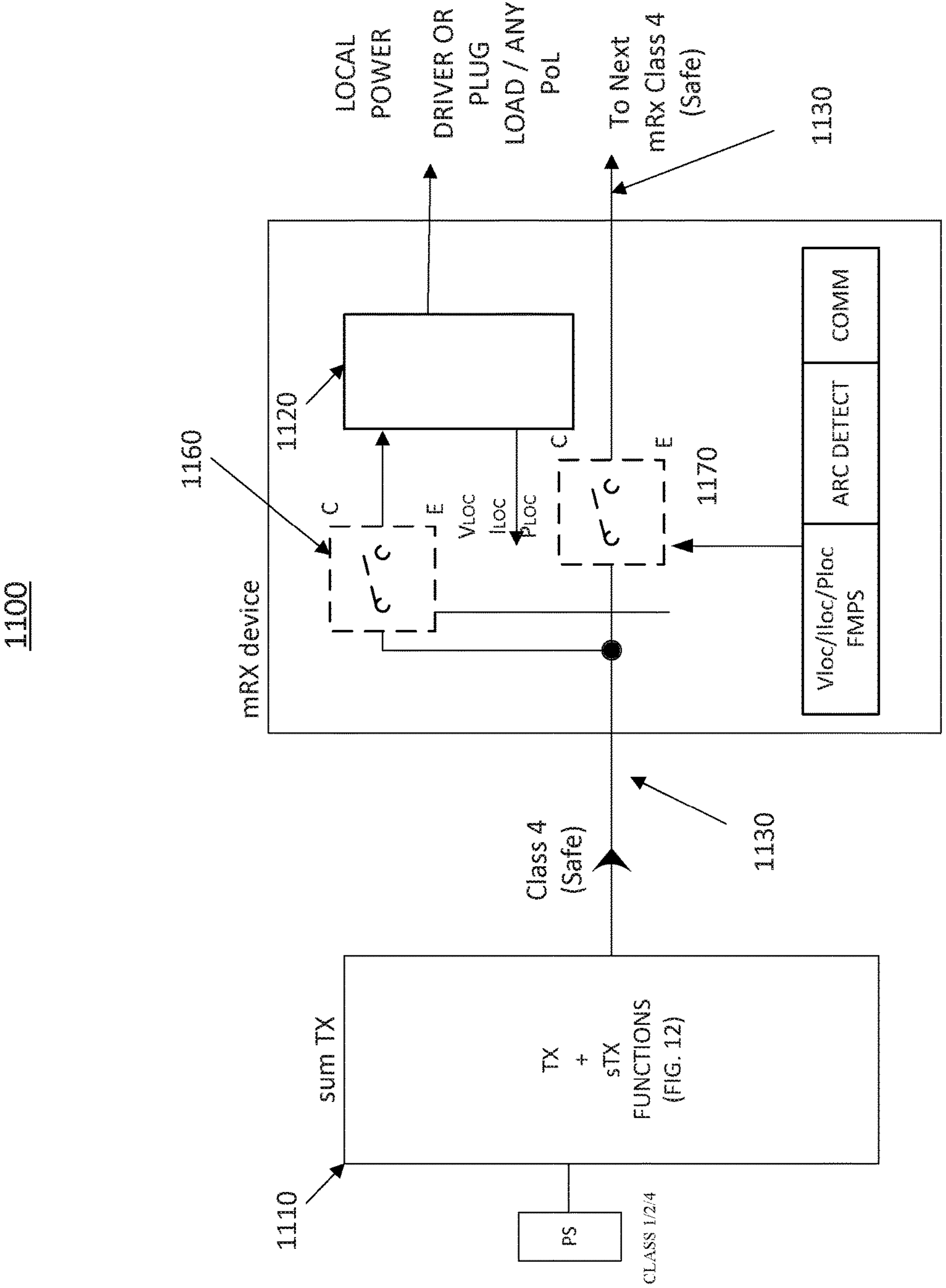
FIGS. 11A-11C illustrate an example of an improved summed transmitter and multi receiver for use within an FMPS, in accordance with an embodiment of the present disclosure.
Figure 11C:
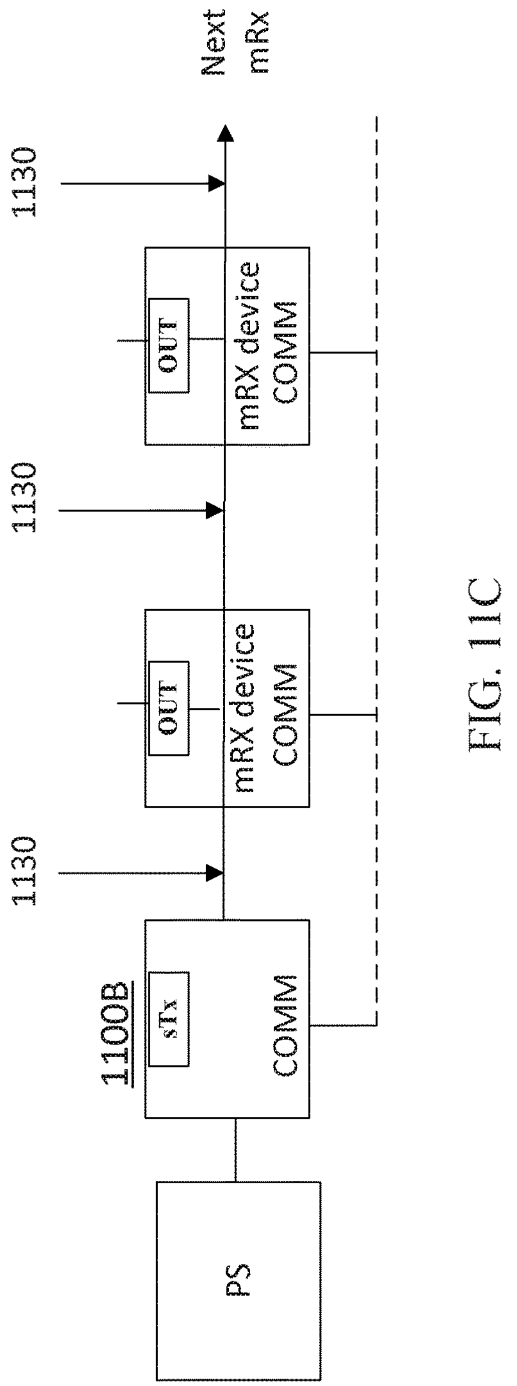
Figure 11B:
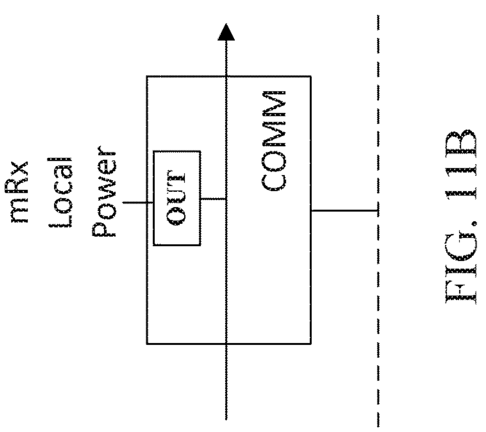

FIG. 11A-C illustrate an example of an improved summed transmitter and multi receiver system 1100 for use within an FMPS, in accordance with an embodiment of the present disclosure.

FIG. 11A shows system 1100 may include sum TX 1110 corresponding to a transmitting device integrated with a power and optional current sum logic (e.g., sTX functions) of all the TXs to provide an improved summed transmitter and multi receiver system 1100. For example, system 1100 may be configured to connect with mRX device having multiple receiver 1120 components integrated with an optional switch 1160 configured to interrupt power flow to local devices or PoL components. Switch 1070 may be configured to be in communication with FMPS control 1150 to receive instructions for transitioning from an open state to a closed state, and vice versa. For example, responsive to receiving an instruction to disrupt the iTX output circuit to the next in the daisy-chaining, switch 1070 may be configured to toggle or transition from a closed state to an open state. Once switch 1070 is open, no power may be conducted from that point on through iTX daisy-chain power out. Switches 1160 and 1070 may serve to implement graceful degradation and diagnostics on where, for example, in a daisy-chain there is a line-to-line short and be able to isolate that from the preceding part of the circuit. In addition, the switch 1070 can be used to implement an auto-addressing of devices in order of the daisy chain itself.

Furthermore, system 1100 may be configured to integrate broadcast communications via the power conductors for the additional benefit of reducing the number of communication devices cRX and cTX in the network, as opposed to relying on point-to-point communication methods. Further, reducing communication components within system 1100 reduces the need for cabling resources, thereby avoiding issues with wireless reliability and latency limits of 3 ms with respect to shock protections of V>60V. For example, communication between (i/s)TX and (m)RX must support the data transfers that allow the FMPS's feedback and control fault safety functions on class 4 conductors. Each fault type includes corresponding sensing data, data analysis function, sensor synchronization, and latency needs.

Referring to FIG. 11B, mRX component is illustrated as a simple version of receiver 1100 component, but with the same functionality.

Referring to FIG. 11C, a daisy chain using the sTX and multiple mRX units is shown.

Figure 11D:
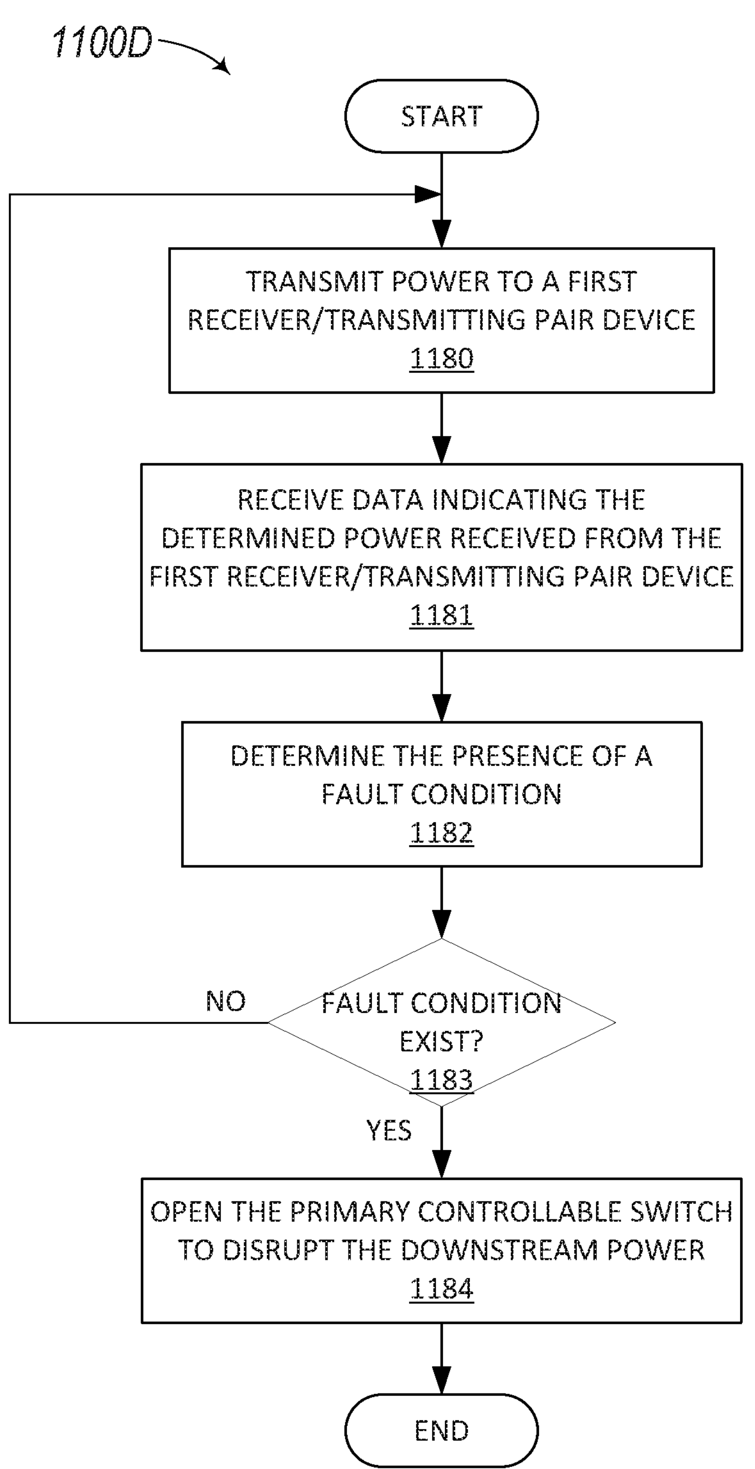
FIG. 11D is a flowchart diagram depicting the process for another example embodiment for transmitting power consistent with the present disclosure.

FIG. 11D is a flowchart diagram 1100E depicting the process for another example embodiment for transmitting power consistent with the present disclosure. It should be appreciated that FIG. 11D provides only an illustration of one implementation and does not imply any limitations with regard to the environments in which different embodiments may be implemented. Many modifications to the depicted environment may be made by those skilled in the art without departing from the scope of the disclosure as recited by the claims.

The process includes transmitting power to a first receiver/transmitting pair device (operation 1180). In the illustrated example embodiment, a transmitting device generates power that is transmitted to a first receiver/transmitting pair, i.e., a device arranged in a daisy chain configuration where each device receives the input power from the previous device in the chain, rather than directly from a primary transmitting device, and each device may be configured to transmit power to the next device in the chain.

The process also includes receiving data indicating the determined power received from the first receiver/transmitting pair device (operation 1181). Responsive to receiving the power transmitted by the transmitting device, each receiving device may provide local power to a local load. Each receiving device communicates data indicative of the local power to the transmitting device.

The process also includes determining the presence of a fault condition (operation 1182). Responsive to receiving the data indicative of the local power from each of the one or more receiving devices, the transmitting device determines if a fault condition exists. If a fault exists on any of the receiver/transmitting pair devices, that device sends a communication of the fault to the transmitting device.

The process also includes does a fault condition exist? (decision block 1183). If it is determined a fault condition does exist ("yes" branch, decision block 1183), then the process proceeds to operation 1184. If it is determined that a fault condition does not exist ("no" branch, decision block 1183), then the process returns to operation 1180 to continue to transmit power.

The process also includes opening the controllable switch to disrupt the downstream power (operation 1184). If it is determined a fault condition does exist, then the transmitting device will open the controllable switch to disconnect the output power, thereby preventing power from being transmitted to the one or more receiving devices.

Figure 11E:
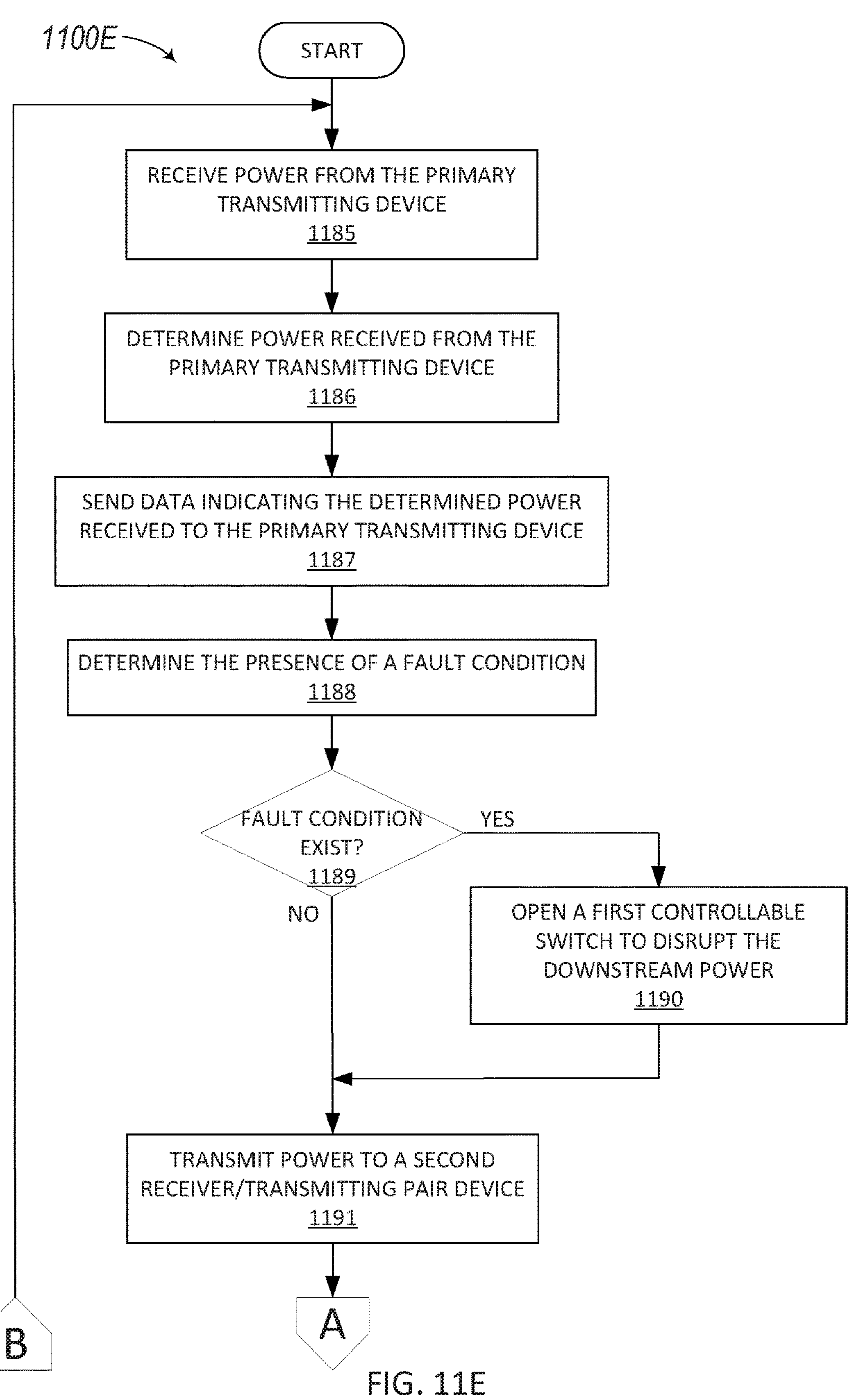
FIGS. 11E-11F is a flowchart diagram depicting the process for one example embodiment for receiving power consistent with the present disclosure.
Figure 11F:
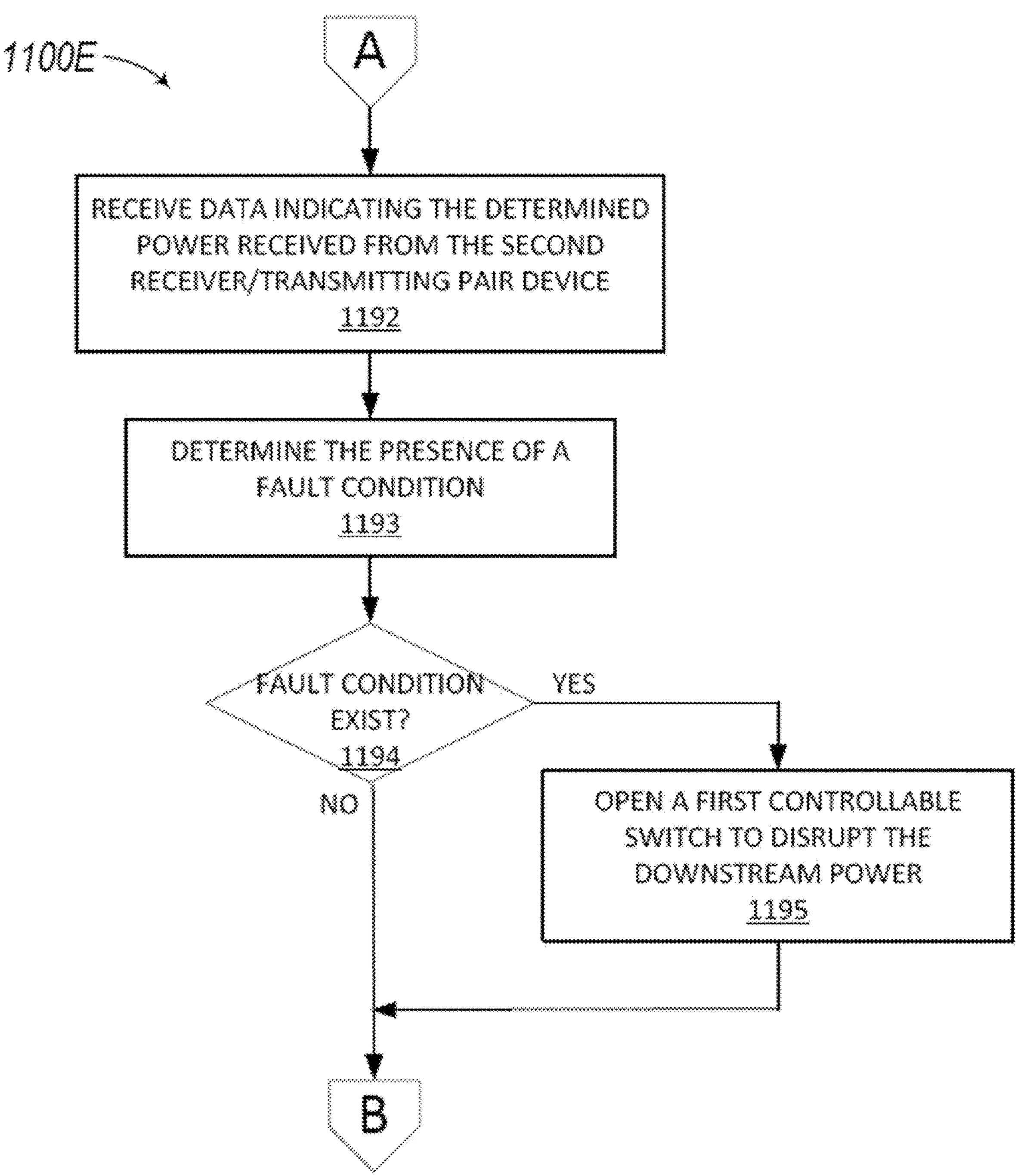

FIGS. 11E-11F is a flowchart diagram 1100F depicting the process for one example embodiment for receiving power consistent with the present disclosure. It should be appreciated that FIG. 11E provides only an illustration of one implementation and does not imply any limitations with regard to the environments in which different embodiments may be implemented. Many modifications to the depicted environment may be made by those skilled in the art without departing from the scope of the disclosure as recited by the claims.

The process includes receiving power from the primary transmitting device (operation 1185). In the illustrated example embodiment, a first receiver/transmitting pair device receives power from a transmitting device.

The process also includes determining power received from the primary transmitting device (operation 1186). Responsive to receiving the power transmitted by the primary transmitting device, the first receiver/transmitting pair device may provide power to a local load as well as to a second receiver/transmitting pair device.

The process also includes sending data indicating the determined power received to the primary transmitting device (operation 1187). Responsive to determining the received power, the first receiver/transmitting pair device communicates data indicative of the received power to the primary transmitting device.

The process also includes determining the presence of a fault condition (operation 1188). The primary transmitting device compares the sum of the data indicative of the received power from each receiver/transmitting pair device to the output power of the transmitting device. In an embodiment, a fault condition may exist if the sum of the received power from each of the receiver/transmitting pair devices exceeds the output power of the transmitting device by a predetermined threshold. The primary transmitting device also receives a fault indication from any of the receiver/transmitting pair devices if any device determines that a fault condition exists in that receiver/transmitting pair device. In an embodiment, standards, for example, UL 1400-1, §§ 6.1-6.4, limit the maximum power that can be delivered into a series or parallel fault shall not exceed 100 W, measured after 5 seconds. Therefore, if the power transmitted minus the sum of the received power is greater than 100 W, then a power fault is true.

It should be noted that this power fault is determined from the transmitted and received power, but other power faults, such as arc-fault, ground leakage, electric shock (fault current and let-go voltage), overvoltage, and overcurrent may be detected and reported to the transmitting device to cause a fault response.

The process also includes does a fault condition exist? (decision block 1189). If it is determined a fault condition does exist ("yes" branch, decision block 1189), then the process proceeds to operation 1190. If it is determined that a fault condition does not exist ("no" branch, decision block 1189), then the process proceeds to operation 1191.

The process also includes opening a first controllable switch to disrupt the downstream power (operation 1190). If it is determined a fault condition does exist, then the first receiver/transmitting pair device will open the first controllable switch to disconnect the output power, thereby preventing power from being transmitted to a second receiver/transmitting pair device, i.e., the next receiver/transmitting pair device in the daisy chain.

Process also includes transmitting power to a second receiver/transmitting pair device (operation 1191). If it is determined a fault condition does not exist, then the first receiver/transmitting pair device will transmit power to the second receiver/transmitting pair device.

The process also includes receiving data indicating the determined power received from the second receiver/transmitting pair device (operation 1192). Responsive to receiving the power transmitted by the first receiver/transmitting pair device, the second receiver/transmitting pair device may provide power to a local load as well as to a third receiver/transmitting pair device. The second receiver/transmitting pair device may communicate data indicative of the local power to the first receiver/transmitting pair device and/or to the primary transmitting device.

The process also includes determining the presence of a fault condition (operation 1193). The first receiver/transmitting pair device compares the sum of the local power data and the transmitted power from the second receiver/transmitting pair device to the output power of the first receiver/transmitting pair device. In an embodiment, a fault condition may exist if the sum of the local power data and the transmitted power from the second receiver/transmitting pair device exceeds the output power of the first receiver/transmitting pair device by a predetermined threshold. In addition, if the second receiver/transmitting pair device determines that any other fault condition exists, the second receiver/transmitting pair device communicates that fault condition to the first receiver/transmitting pair device and/or the primary transmitting device.

The process also includes does a fault condition exist? (decision block 1194). If it is determined a fault condition does exist ("yes" branch, decision block 1194), then the process proceeds to operation 1195. If it is determined that a fault condition does not exist ("no" branch, decision block 1194), then the process returns to operation 1185 to continue to receive power.

The process also includes opening the first controllable switch to disrupt the downstream power (operation 1195). If it is determined a fault condition does exist, then the first receiver/transmitting pair device will open the first controllable switch to disconnect the output power, thereby preventing power from being transmitted to a second receiver/transmitting pair device, i.e., the next receiver/transmitting pair device in the daisy chain. The process then returns to operation 1170.

Additional safety can be implemented via an additional air-gap device in series to the TX output switch (1210 in FIG. 12A) which is typical a semiconductor switch.

To achieve a tree-wiring method and remove the need to pass the full power through a current or power sensor, a power and current summation method is disclosed. For example, the power and current summation method may include connecting all receiver device components (e.g., mRXs) to provide receiver sensing data (e.g., current sensing data, power sensing data) to determine the sum of current and/or power sensed at the receivers. Next, the summation of the current and/or power may be compared to determine if a fault condition is detected. If a fault condition is detected, the sTX switch may be toggled from closed to open to open the circuit and interrupt power flow through the circuit.

Figure 12:
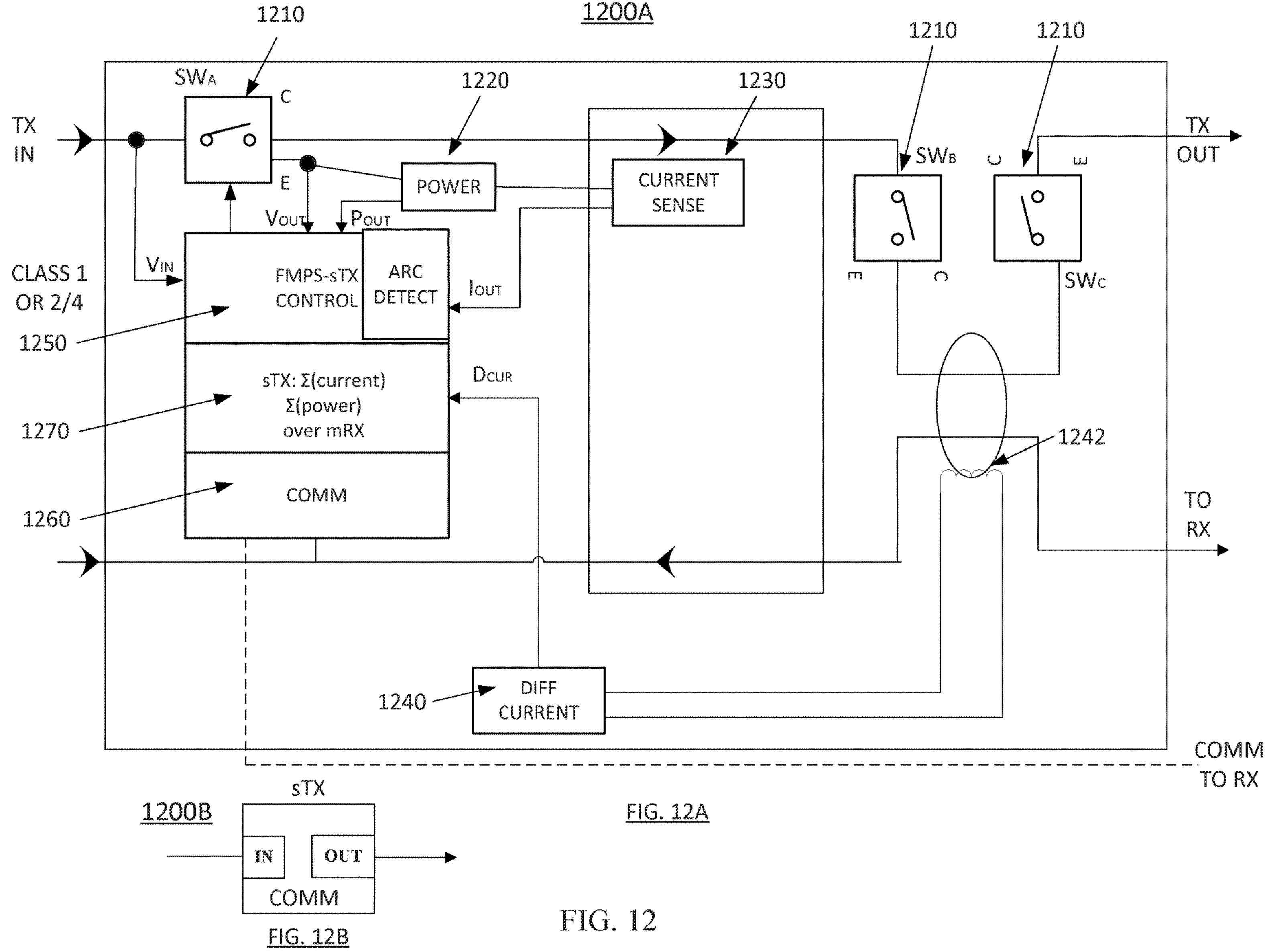
FIGS. 12A-12B illustrate example transmitter components with (multi-)receiver feedback and communication control within an FMPS, in accordance with an embodiment of the present disclosure.

The sTX component within sum TX 1110 is similar to transmitter 700A extended to FIG. 12's component TX with the additional sTX functions of summing current and/or power of connected mRX's that are implemented as connected to mRX device in system 1100. This new configuration demonstrates the reduced function and reduced circuitry need of the mRX nodes. Further, this embodiment includes technical improvements to the communication requirements of mRX where a broadcast method does not have the drawback of hop to hop delays between iRX:iTX combinations. Furthermore, the broadcast method may only need a single communication component "Ctx" per "Crx" (i.e., communication transmitter and communication receiver) to facilitate communication between nodes within the network. Thus, having a single galvanic connection between the single TX and the mRX devices indicates that a single arc-detecting circuit may only be needed at the single TX.

Embodiments described herein provide for additional technical improvements of the FMPS systems that implement a tree/branch free-style wiring configuration of a single pair of conductors without conduit, same as class 2 while enhanced with more power and optionally higher voltage capability. Further, while the improved FMPS systems are enabled with higher power and voltage limits, keeping the additional mRX costs marginal, lighting installations may be implemented with significant improvements as energy and power measurements are readily available most LED driver power supply designs.

Furthermore, PoL devices may be configured to benefit from enabling efficient, compact, and easy installation within an electrical wiring system for lighting or other PoL devices. Further, embodiments described herein provide cost effective (m)RX device(s) to the primary TX power supply with the last leg of up to 30-200 ft of cable. For example, below is a list of possible devices to benefit in the last 30-200 ft of cable installations: luminaries with light emitting diodes (LEDs) as PoL supply, electrical outlets (e.g., USB-C), 120 $V_AC$ traditional electrical outlets even in a further DC building, blind controllers, medical equipment (e.g., Echocardiogram, pumps), monitors (e.g., TV, computer display), dishwashers, microwaves, and other household appliance and consumer electronics. Each of these devices can have different PoL power needs such that local AC or DC power could be used for AC and/or DC output generation. Further, other connected power conversion stages may result in class 1, class 2, or even class 4 output power classifications.

For example, regarding fire: arc detection (line to line and in-line), the fault detection may be based on at least one RF and or V/I profile arc detection per class 4 conductor pair. If the detection is also part of the (m)RX, the upstream located (primary/s)TX may be informed of a fault to interrupt power flow using the TX switch within the TX. Additionally, any TX type can detect arc faults using the TX embedded sensing components and can open the local switch to disrupt the circuit in the event of a detected fault condition. The TX component can also send out fault detection information (e.g., fault detected) over the external communication channel to inform other network devices of the fault event.

Further embodiments described herein include multiple arc detection components (e.g., TX, (m)RX(s)) located throughout the class 4 conductors to reduce the chance of false positives and/or negatives by providing redundancy and resilience within the network. Fault detection, as described herein, may not need synchronization other than synchronization could reduce false positives and/or negatives from occurring within the network. Further, latency may be in the order of 100 ms with 16 A typical trip latency of AFCI's at a certain current, while the data itself could be as simple as a bit (triggered or not) or an RF detection profile indicating data packet.

Regarding fire: resistive losses (line to line and in-line), fault detection may be based on the difference of TX power delivered to the class 4 conductors versus the RX power being received. Alternatively, embodiments described herein provide for the calculation of the sum of mRX's power being received. For this power difference detection, embodiments described herein provide each mRX's sensed power level(s) via a communication method to the FMPS summation power function. At the TX the sent power level using the TX's power output sensing is then compared with the total RX power. If there is too much power loss, typically 100 W over 100 ms, then the TX power switch must be turned off. The power sensor data(s) are regularly sensed with some synchronization in place such that local load changes do not lead to false positive fault triggers. Synchronization can happen, for example, by individual poll requests to each mRX where TX and RX sense sampling times may be linked to the first poll request with a sync flag indication.

Shock conditions may be defined as line to line and line to ground voltage of >60V, or a current loss greater than typically 10-30 mA for down to 3 ms (450 Vdc estimate, max time dependent on voltage). For example, a sense ground fault current thresholds of 30 mA DC, approximately 6 mA-rms AC may be established, as defined by International Electrotechnical Commission standards IEC62752, IEC62955, and/or IEC60479-1. Differential current sensing will detect line to earth. Regarding line to line, (s/i)TX and (m)RX current sensing should match the outgoing TX current with the (summed m)RX current. If a fault is detected, then the TX output switch is turned off. Measurements should be synchronized to prevent local load changes not leading to false positive fault triggers. Current(s) can be communicated similar to the power(s) methods mentioned in the resistive losses section above.

FIGS. 12A-12B illustrate example transmitter 1200A (simplified in 1200B) components with feedback and communication control within a FMPS, in accordance with an embodiment of the present disclosure. It adds the sTX summation functions versus FIG. 7.

Referring to FIG. 12A, transmitter 1200A component may be configured to operate similarly as transmitter 700A component with the addition of sTX summation 1270 component to receive power, current and/or voltage sense data to determine if a fault condition exists within the connected network. Further, transmitter 1200A component may be configured to communicate with other transmitters and receivers within the FMPS network, wherein communication between fault management TX and RX devices should be efficient, cost, and size effective.

Transmitter 1200A component is shown as a detailed version of simplified transmitter 1200B component. An example embodiment of transmitter 1200A component may include one or more switches 1210 (e.g., TX's interrupter switch with optional locations at e.g. $SW_A$, $SW_B$, $SW_C$) positioned between $TX_{IN}$ and $TX_{OUT}$ configured to interrupt power flow through transmitter 1200A component. Each switch 1210 may be configured to be connected to FMPS-TX control 1250 to receive instructions for transitioning from an open state to a closed state, and vice versa. For example, responsive to receiving an instruction to disrupt the circuit, switch 1210 $SW_A$ may be configured to toggle or transition from a closed state to an open state. Once switch 1210 $SW_A$ is open, no power may be conducted from that point on through $TX_{OUT}$. Similarly, switches 1210 $SW_{B/C}$ may be configured to toggle or transition from a closed state to an open state responsive to receiving an instruction from FMPS-TX control 1250 to interrupt power flow from switch 1210 $SW_{B/C}$ on through $TX_{OUT}$.

Transmitter 1200A component may include power 1220 component configured to determine a power measurement flowing through the circuit and transmit power data to FMPS-TX control 1250 for monitoring, managing, and protecting the circuit from detected fault conditions.

Transmitter 1200A component may include current sense 1230 component configured to determine a current measurement flowing through the circuit and transmit current sense data to FMPS-TX control 1250 for monitoring, managing, and protecting the circuit from detected fault conditions.

Transmitter 1200A component may include differential current 1240 component configured to receive current differential data from inductive or coil 1242 component to determine a current difference measurement between $TX_{OUT}$ and the line out to RX. Differential current 1240 component may also be configured to transmit the current differential data to FMPS-TX control 1250 for monitoring, managing, and protecting the circuit from detected fault condition. The transmitter 1200A may also include an RF arc fault detection (ARC DETECT), as described herein.

Transmitter 1200A component may include FMPS-TX control 1250 configured to facilitate control of the one or more switches 1210 to disrupt the power flow through transmitter 1200A component if a fault condition is determined to exist within the FMPS network. For example, FMPS-TX control 1250 may be configured to receive current, voltage, or power data from the corresponding components therein to determine if one or more of the measurements within the received data satisfies a condition (e.g., exceeds a threshold) for a fault condition. Responsive to determining that a fault condition exists, FMPS-TX control 1250 may be configured to transmit an instruction (e.g., signal) to one or more of the switches 1210 to interrupt the circuit, thereby terminating power flow through transmitter 1200A component. Additionally, FMPS-TX control 1250 may be configured to receive data from communications 1260 component corresponding to detection of a fault condition (e.g., ground fault) detected further upstream in another larger electrical system and transmit a signal to interrupt the circuit using the one or more switches 1210.

Transmitter 1200A component may include communications 1260 component configured to facilitate communications between components within transmitter 1200A component and devices external to the same. For example, communications 1260 component may be configured to receive input voltage data (e.g., $V_{IN}$), output voltage data (e.g., $V_{OUT}$), output power data (e.g., $P_{OUT}$), output current data (e.g., $I_{OUT}$), control data (e.g., data from FMPS-TX control 1250), receiving device data (e.g., RX data) from a receiving device external to transmitter 1200A component to determine if a fault condition exists within the FMPS network.

Transmitter 1200A component may include sTX 1270 component configured to perform a summation operation on current data and/or power data received therein, similar to the description of sum TX 1110 described above herein.

Referring to FIG. 12B, transmitter component 1200B is illustrated as a simple version of transmitter 1200A component, but with the same functionality.

In addition, real time data communication between RX and TX FMPS feedback and control must be sufficiently reliable to ensure robustness of power delivery. Real time data communication is critical to detecting fault conditions to prevent loss of equipment or reduce the chance of injury by timely implementing power shutdown followed by a fault recovery method. For example, an embodiment described herein is configured to integrate communication on the two power conductors using power line communication (e.g., RF coupling or current/voltage pulsing). Further, an embodiment described herein includes one or more conductors or optical fibers in combination with the two power conductors using a wired communication method (e.g., RS485, DMX, CAN, SPE). Furthermore, wireless communication (e.g., Bluetooth, WIFI, ultra-wide band, multi-path redundancy) may be implemented to facilitate communication within the FMPS network. Therefore, embodiments described herein could be implemented with each of the above approaches as long as reliability, real timeliness (latency), bandwidth are met related to the required fault protection measures (fire, optional shock).

Figure 13:
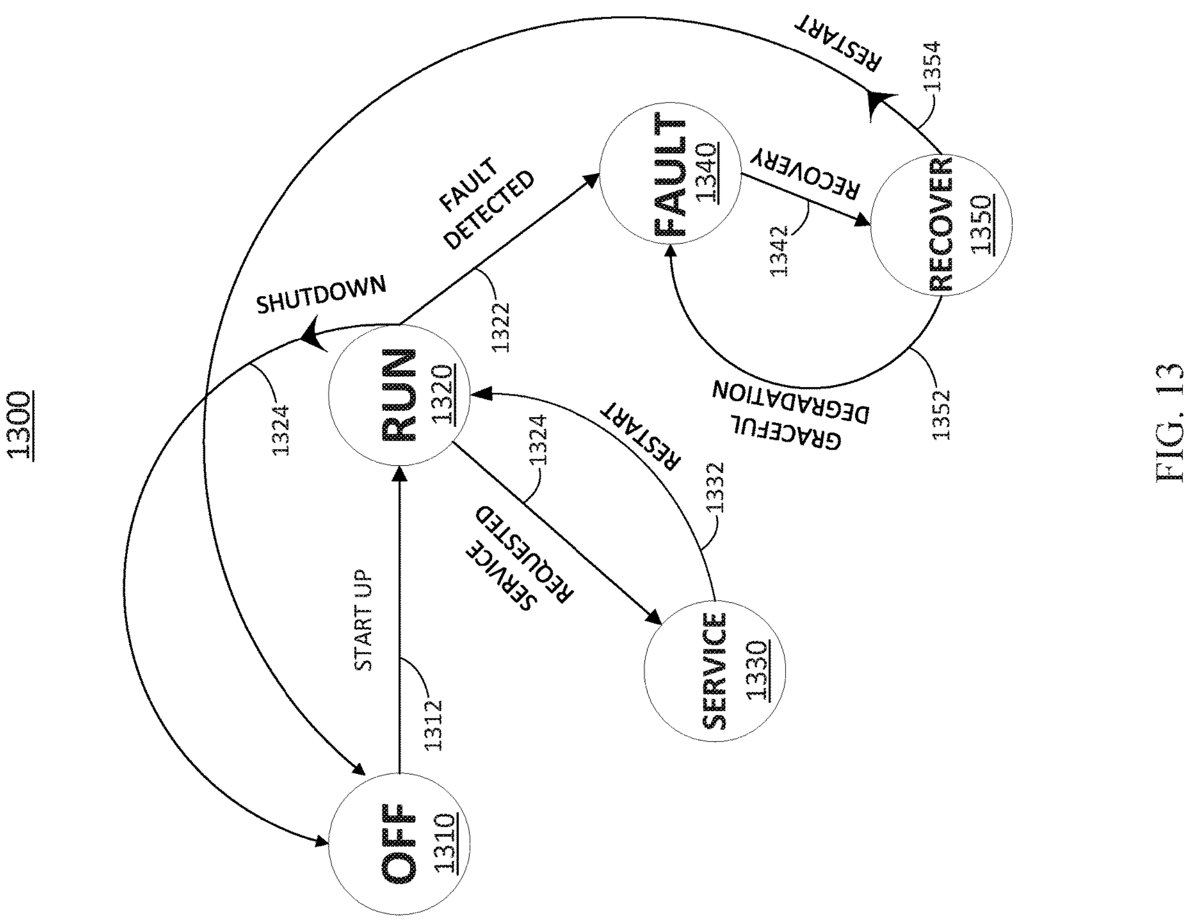
FIG. 13 illustrates an example of key states and transitions of the FMPS, in accordance with an embodiment of the present disclosure.

FIG. 13 illustrates an example of key states and transitions process 1300 of the FMPS, in accordance with an embodiment of the present disclosure.

Process 1300 may include various states and transitions of the FMPS when in operation and managing fault conditions as they are detected within the network. For example, process 1300 may begin in the Off 1310 state and then transition via the start operation 1312 to the Run 1320 state upon receiving a command or instruction to begin operation. While in the Run 1320 state, FMPS control may determine that a fault condition was detected 1322 and transition to the Fault 1340 state. While in the Fault 1340 state, process 1300 may transition to the Recover 1350 state by performing a recovery operation 1342. For example, a recovery operation 1342 may include determining the location of the fault condition, determining the device (e.g., TX, RX) that experienced the fault or was the closest proximity to the fault, and perform one or more actions to restore the integrity of the network. For example, while in the Recover 1350 state, process 1300 may be configured to transition to the Off 1310 state via a restart operation 1354. Further, while in the Recover 1350 state, process 1300 may be configured to transition to the Fault 1340 via a graceful degradation operation 1352.

Other embodiments of process 1300 may include transitioning from the Run 1320 state to the Service 1330 state responsive to receiving a service request command 1324. While in the Service 1330 state, process 1300 may be configured to perform a restart operation 1332 and transition back to the Run 1320 state.

Key states and transitions 1300 may be configured to provide fault managed power distribution needs that enable the FMPS including TX & RX to safely start and shutdown. In addition, from a detected fault it needs a shutdown method as well as a method to probe recovering safely, potentially with a graceful degradation method, and a method to restart the system to full power if deemed safe. In an embodiment, all the TX & RX state machines may be configured to collaborate via communication that involves exchanging information on the states such that recovery, system and node diagnostics, graceful degradation functions can be implemented. In the cases of installation and service, embodiments described herein are configured to bring the system to a serviceable state for e.g., safely updating firmware or hardware in the larger system. It is important to diagnose where failures are located, even more so with many devices distributed in a space at installation and service events. Further, graceful degradation can be performed by using the local or next daisy chained device power off switches or even only providing class 2 output power if no RX FPMS communication nodes are detected.

In an embodiment, key states and transitions 1300 may include key states of each of the TX and RX devices with their key state transitions. For example, off state with transitions may correspond to Start function 1312 being performed, then moving to the Run state. This function enables all fault protections from power up and engage the TX switch to power on.

In an embodiment, run state with transitions may correspond to shutdown function 1324, which moves to the Off (1310) state from Run (1320), for example, due to an imminent power down event. The shutdown function 1324 may be configured to safely shut down from loss of input power and implement last gasp actions to save key information on, for example, faults and graceful local shutdowns. Furthermore, for example, fault function may be configured to move to the Fault state, wherein this function starts by a fault being detected 1322, then it is resolved, and the system goes into a safe fault mode which could still enable by current, voltage and/or power limit a little safe power to speed potential recovery (e.g., a limp home with class 2 limits). The Fault function may be configured to keep a diagnostic record of the faults for further study in service/diagnose mode.

In an embodiment, service request function may be configured to move to the Service state, wherein the service request function 1324 may be used in service situations where the system could be brought into an even safer (voltage/current/power limit) power condition (e.g. for reasons of cabling or component replacement work) while acquiring diagnostics information to detect fault devices, which were potentially already in a graceful shut off, for example, because of a local power short.

In an embodiment, Fault state 1340 with transitions may include a recover retry function 1342, and then moves to the Recover state 1350, wherein the recover retry function 1342 may be configured to determine a rate of recovery attempts based on fault type(s), graceful degradation options and states, duration of fault (e.g., retry faster initially).

In an embodiment, Recover state 1350 with transitions may include a restart function 1354, which may be configured to move to the Off state 1310 which then falls through to the Run state 1320. If the fault clears, then the system is allowed to restart.

In an embodiment, graceful degradation function 1352 moves to the Fault state 1340, wherein if the fault persists, this function determines actions to take on, for example, graceful degradation 1352 to turn off (a) local short(s), limiting output power, etc.

In an embodiment, Service state 1330 with transitions may include the restart function 1332, which may be configured to move to the Off state 1310 which then falls thru to the Run state 1320, wherein the Service mode 1330 can give diagnostic information on, for example, fault events, graceful degradation status, and actual voltage/current/power at TX and RX. The restart function 1332 may be configured for turning off all local power and reduced power/voltage/current limits to make work on the system safe.

FIG. 14 illustrates an example of table 1400 of potential use cases for a power converter, or pass-through hub, in accordance with an embodiment of the present disclosure.

In an embodiment, various benefits may be realized with the multi-class and cross-class methods described herein. For example, table 1400 shown in FIG. 14 highlights potential use cases for a power converter, or pass-through hub, from an input class to an output class with appropriate safety measures related to each input and output class. For example, some use case descriptions are as follows: daisy chain—pass through or optional V/I power conversion with appropriate safety class fault protections; high (>60V, >100 W), medium (<60V, >100 W), low (<60V, <100 W) power providing Point-of-Load delivered power availability; high (>60V, >100 W), medium (<60V, >100 W), low (<60V, <100 W) power providing appropriate fault managed TX output for connected RX: >100 W implements fire fault protections, >60V implements shock fault protections; voltage boost enables higher outgoing voltage; and class 4 bridging from a high power (>60V) to medium power (<60V) output implementing power conversion.

Referring to FIG. 14, embodiments described herein may be configured to implement a multi-class input and/or multi-class supporting output method leading to product (portfolio) benefits. For example, an LED driver or USB-C hub product may be configured to implement the fault detection methods described herein with class 4 LV with a power input <60V supporting both class 4 LV AND SELV. This fault detection method may be configured to allow connecting the USB-C hub or LED driver type PoL device to a US Class 4 TX or an EU SELV power supply. This embodiment may be configured by using the exact same product with plastic housing, non-earthed devices in EU and US without using conduit (as per EU use case now with SELV). For example, class 1 US drivers are earthed and have a metal housing to be integrated in conduit and closed boxes.

Embodiments described herein may be configured to implement the sTX and mRX method described in system 1100 and system 1200A because influence on power efficiency, cost, and size are negligible. Further, as another example, an LED driver or USB-C hub type PoL device may be implemented using embodiments described herein supporting both a class 1 (AC or DC) or non-SELV (e.g., 230 Vac or 380/480 Vdc) RX, as well as a class 4 HV mRX. This embodiment's configuration enables state of the art PoL devices to be implemented with a wide input range with class 1, non-SELV, and class 4 HV classifications.

Furthermore, there are meaningful cross-state methods that support class transitioning when not all devices in a space can be implemented for a certain class. For example, a class 2 RX could be connected to a class 4 TX LV by providing a maximum of class 2 power (<100 W, <60V) with the method of detecting no class 4 LV mRX connected for a limited power use case (e.g., detection by class 4 communication). Further, for example, a class 2 TX could be connected to a class 4 RX LV by using class 2 input power in case no class 4 TX fault conditions are detected.

Figure 15:
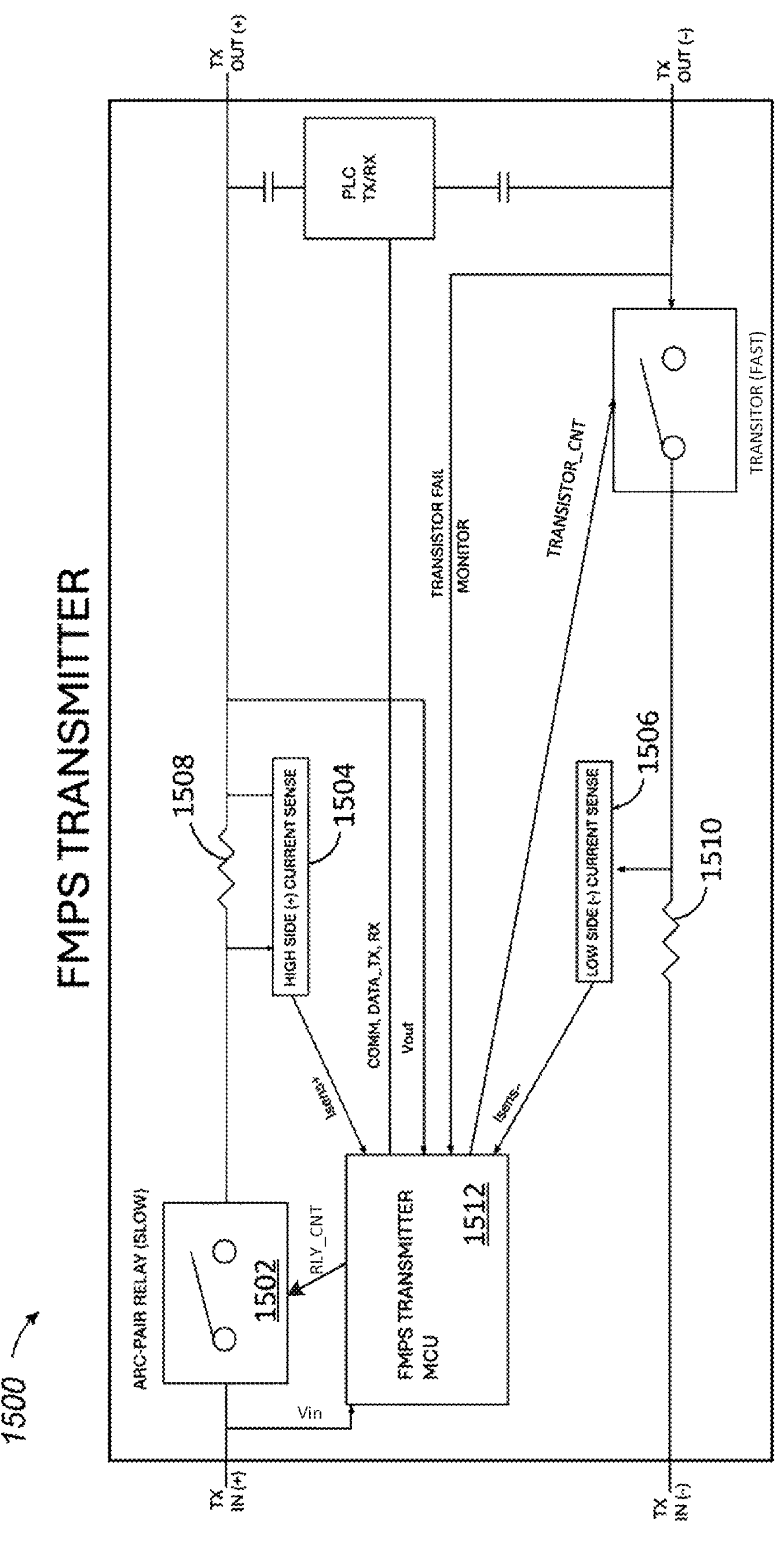
FIG. 15 illustrates an example of an FMPS transmitter, in accordance with an embodiment of the present disclosure.

FIG. 15 illustrates an example of an FMPS transmitter 1500, in accordance with an embodiment of the present disclosure. In the illustrative embodiment of FIG. 15, the FMPS transmitter 1500 is configured to use a Power Line Carrier (PLC) communication method. The use of the PLC communication method in this embodiment includes significant benefits compared to other communication methods. Since no additional cables or wires are needed, it is a low cost solution, and not requiring any additional cables or wires reduces installation time and labor cost. In addition, the communication is fast, which enables real-time data and a fast response in case any of the six safety faults are detected in the FMPS. Since FMPS systems specifications do not allow mixing of the 3rd party equipment, this PLC communication method is reliable since the manufacturer/supplier would provide the transmitter and receiver as a system.

Although there are other communication protocols disclosed herein that may be used instead of the PLC in other embodiments, there are some critical downsides to each protocol. Wired protocols (e.g., RS485, CAN, etc.) all require additional wires or specialized twisted pair cables, which increases system cost, installation complexity, labor cost, and reduce reliability.

In the case of wireless protocols (e.g., Bluetooth, WIFI, Zigbee, ultra-wide band, etc.), a major drawback is low reliability due to installation errors and different installation environments that may reduce the RF range and cause propagation delays, which are not acceptable for the FMPS system. Fiberoptics is the most costly solution because it requires specialized fiberoptic cables and installation equipment.

The transmitter 1500 includes an airgap relay 1502 to safely disconnect the output (TX OUT+ and TX OUT−) in case the internal electronics in the transmitter fail (e.g., the main fast transistor). The airgap relay 1502 will ensure that there is no voltage on the Class-4 output and, therefore, be safe for technicians to service the system. The relay will turn off the power to the output if the main fast switching transistor cannot reduce voltage/current/power/energy under the safe limits for any of the six faults specified in UL1400-1. This airgap relay 1502 is typically Normally Open (NO) or latching, Single Pole Single Throw (SPST) and a low coil voltage relay.

Both the transmitter 1500 and the receiver 1600 (see FIG. 16 below) include return path sensing. The transmitter 1500 includes high side current sense 1504 and low side current sense 1506, while the receiver 1600 includes low side current sense 1606.

The current sense resistor (1508 and 1510 for the transmitter 1500, and 1610 for the receiver 1600) are low milliohms to minimize power and voltage loss, and an additional amplifier circuit may be needed to amplify the voltage signal across the current sense resistor. The voltage output of an op-amp not shown) is fed to an analog input of an FMPS MCU 1512, 1612. The FMPS MCU 1512, 1612 correlates the measured voltage with the actual load current through the current sense resistor.

Figure 16:
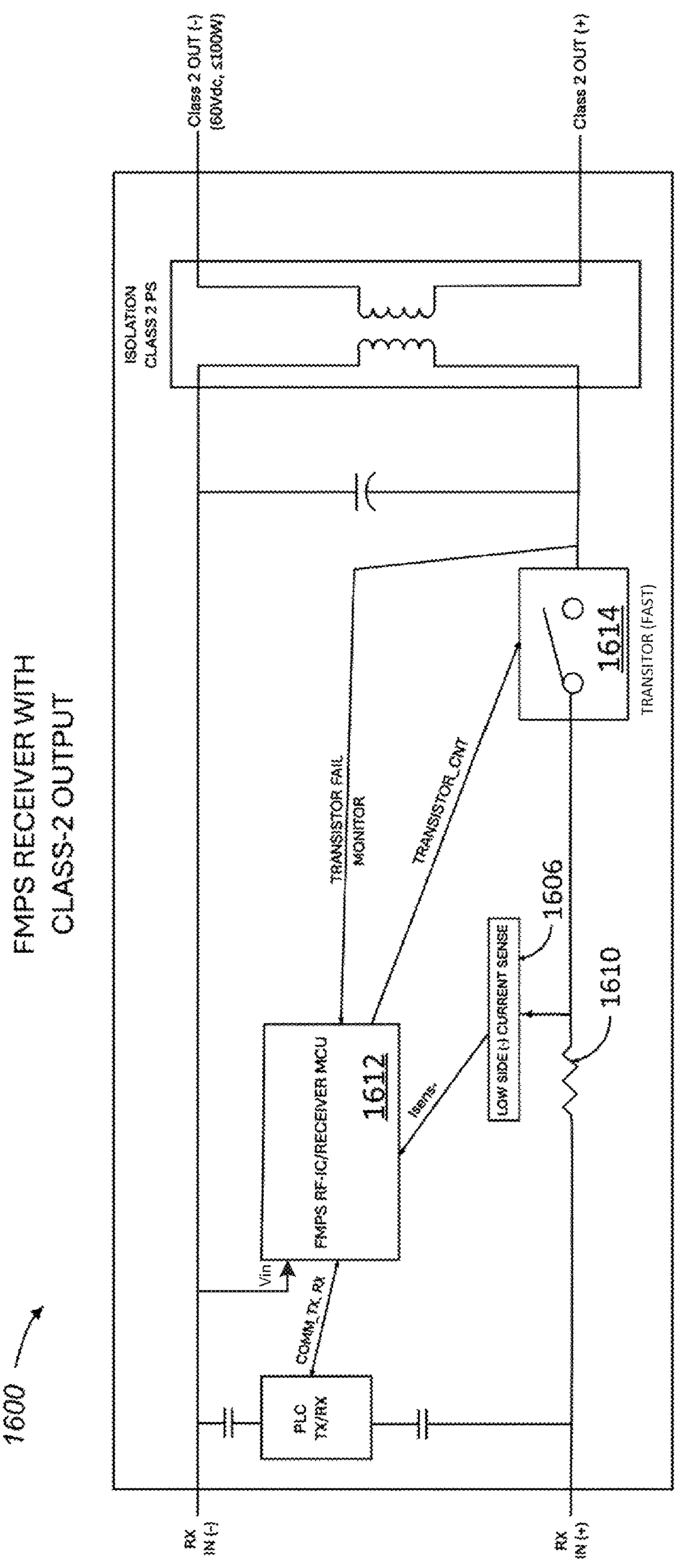
FIG. 16 illustrates an example of an FMPS receiver with Class-2 outputs, in accordance with an embodiment of the present disclosure.

FIG. 16 illustrates an example of an FMPS receiver with Class-2 outputs, in accordance with an embodiment of the present disclosure. It should be noted that although in this specific embodiment the receiver output is Class-2 (low-voltage, low power), in other embodiments it may be a Class-1 (120/277 VAC), a Class-3, or a Class-4 output.

The receiver 1600 may include an isolation transformer 1614, which is required for Class-2 low voltage/low power output. Note that in other embodiments the receiver output may be Class-1 which would also require an isolation transformer.

According to one aspect of the disclosure there is thus provided a system for distributed power and fault management, the system comprising: a transmitting device to generate power to a plurality of receiver devices, the transmitting device comprising: power sensing circuitry to determine a power output to the plurality of receiving devices; a controllable switch to control the power output from an input to an output of the transmitting device; and fault management protection circuitry to determine presence of a fault condition and to control a state of the controllable switch based on the presence of the fault condition; a plurality receiving devices coupled to the transmitting device, each receiving device to provide local power to a local load and to communicate, to the transmitting device, data indicative of the local power; and wherein the fault management protection circuitry of the transmitting device further configured to sum a received local power data from each receiving device and to determine the fault condition by comparing the sum of the received local power data from each receiving device to the output power of the transmitting device.

According to another aspect of the disclosure there is thus provided a system for distributed power and fault management. The system comprises a primary transmitting device to generate a primary output power, the primary transmitting device comprising: a primary controllable switch to control the primary output power from an input to an output of the primary transmitting device; and primary fault management protection circuitry to determine presence of a fault condition and to control a state of the primary controllable switch based on the presence of the fault condition; a first receiver/transmitting pair device coupled to the primary transmitting device, the first receiver/transmitting pair device to determine an input power received from the primary transmitting device and to communicate, to the primary transmitting device, data indicating the input power received from primary transmitting device. The first receiver/transmitting pair device comprises a first controllable switch to control a first output power from an input to an output of the first receiver/transmitting pair device; and first fault management protection circuitry to determine the presence of a fault condition and to control the state of the first controllable switch based on the presence of the fault condition; wherein the primary fault management protection circuitry further configured to compare the data, from the first receiver/transmitting pair device, indicating the input power received from primary transmitting device to the primary output power; and second receiver/transmitting pair device coupled to the first receiver/transmitting pair device, the second receiver/transmitting pair device to determine an input power received from the first receiver/transmitting pair device and to communicate, to the first receiver/transmitting pair device, data indicating the input power received from the first receiver/transmitting pair device, wherein the first fault management protection circuitry further configured to compare the data, from the second receiver/transmitting pair device, indicating the input power received from the first receiver/transmitting pair device to the first output power.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more non-transitory storage devices having stored therein, individually or in combination, instructions that when executed by circuitry perform the operations. "Circuitry", as used in any embodiment herein, may comprise, for example, singly or in any combination, hardwired circuitry, programmable circuitry such as processors comprising one or more individual instruction processing cores, state machine circuitry, and/or firmware that stores instructions executed by programmable circuitry and/or future computing circuitry including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an Integrated Circuit (IC), System-on-a-Chip (SoC), Application-Specific Integrated Circuit (ASIC), Programmable Logic Device (PLD), Digital Signal Processor (DSP), Field Programmable Gate Array (FPGA), logic gates, registers, semiconductor device, chips, microchips, chip sets, etc.

The storage device includes any type of tangible medium, for example, any type of disk including hard disks, floppy disks, optical disks, Compact Disk Read-Only Memory (CD-ROMs), Compact Disc-Rewritable (CD-RWs), and magneto-optical disks, semiconductor devices such as Read-Only Memories (ROMs), Random Access Memories (RAMs) such as dynamic and static RAMs, Erasable Programmable Read-Only Memories (EPROMs), Electrically Erasable Programmable Read-Only Memories (EEPROMs), flash memories, Solid State Disks (SSDs), including Non-Volatile Memory express (NVMe) SSDs, Embedded Multimedia Cards (eMMCs), Secure Digital Input/Output (SDIO) cards, magnetic or optical cards, or any type of media suitable for storing electronic instructions. Other embodiments may be implemented as software executed by a programmable control device. Also, it is intended that operations described herein may be distributed across a plurality of physical devices, such as processing structures at more than one different physical location.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed is:

1. A distributed power and fault management system, the system comprising:

a transmitting device to generate power to a plurality of receiving devices, the transmitting device comprising:

power sensing circuitry to determine a power output to the plurality of receiving devices;

a controllable switch to control the power output from an input to an output of the transmitting device; and fault management protection circuitry to determine presence of a fault condition and to control a state of the controllable switch based on the presence of the fault condition;

the plurality receiving devices coupled to the transmitting device, each receiving device to provide local power to a local load and to communicate, to the transmitting device, data indicative of the local power; and wherein the fault management protection circuitry of the transmitting device further configured to sum a received local power data from each receiving device and to determine the fault condition by comparing the sum of the received local power data from each receiving device to the output power of the transmitting device.

2. The system of claim 1, further comprising:

a single low-ohmic connection between the transmitting device and each receiving device, wherein ohmic losses associated with the single low-ohmic connection are within tolerances of determining the fault condition.

3. The system of claim 1, further comprising arc detection circuitry to determine an arc fault condition associated with any one of the plurality of receiving devices, the arc fault condition based on a current or voltage associated with the power output.

4. The system of claim 1, the transmitting device is configured to transmit 60 Volts or less, or the transmitting device is configured to transmit 100 Watts or less.

5. The system of claim 1, the transmitting device is configured to transmit 60 Volts or more, or the transmitting device is configured to transmit 100 Watts or more.

6. The system of claim 1, wherein the transmitting device further comprises current sense circuitry to sense a current associated with the power output.

7. The system of claim 1, wherein the transmitting device further comprises differential current sense circuitry to sense a differential current between a power line associated with the power output and a reference line associated with the transmitting device.

8. The system of claim 1, wherein each receiving device comprises communication circuitry to communicate the data indicative of local power, the communication circuitry configured to communicate the data to the transmitting device within 100 milliseconds.

9. The system of claim 1, wherein each receiving device comprises communication circuitry to communicate the data indicative of local power, the communication circuitry configured to communicate the data to the transmitting device within 3 milliseconds.

10. A distributed power and fault management system, the system comprising:

a primary transmitting device to generate a primary output power, the primary transmitting device comprising:

a primary controllable switch to control the primary output power from an input to an output of the primary transmitting device; and primary fault management protection circuitry to determine presence of a fault condition and to control a state of the primary controllable switch based on the presence of the fault condition;

a first receiver/transmitting pair device coupled to the primary transmitting device, the first receiver/transmitting pair device to determine an input power received from the primary transmitting device and to communicate, to the primary transmitting device, data indicating the input power received from primary transmitting device; the first receiver/transmitting pair device comprising:

a first controllable switch to control a first output power from an input to an output of the first receiver/transmitting pair device; and first fault management protection circuitry to determine the presence of a fault condition and to control the state of the first controllable switch based on the presence of the fault condition;

wherein the primary fault management protection circuitry further configured to compare the data, from the first receiver/transmitting pair device, indicating the input power received from primary transmitting device to the primary output power; and a second receiver/transmitting pair device coupled to the first receiver/transmitting pair device, the second receiver/transmitting pair device to determine an input power received from the first receiver/transmitting pair device and to communicate, to the first receiver/transmitting pair device, data indicating the input power received from the first receiver/transmitting pair device, wherein the first fault management protection circuitry further configured to compare the data, from the second receiver/transmitting pair device, indicating the input power received from the first receiver/transmitting pair device to the first output power.

11. The system of claim 10, wherein the primary transmitting device, the first receiver/transmitting pair device, and the second receiver/transmitting pair device are coupled together in a daisy-chain connection.

12. The system of claim 10, wherein the primary transmitting device further comprises arc detection circuitry to determine an arc fault condition associated with any one of the first or second receiver/transmitting pair device, the arc fault condition based on a current or voltage associated with the primary output power.

13. The system of claim 10, the primary transmitting device is configured to transmit 60 Volts or less, or the transmitting device is configured to transmit 100 Watts or less.

14. The system of claim 10, the primary transmitting device is configured to transmit 60 Volts or more, or the transmitting device is configured to transmit 100 Watts or more.

15. The system of claim 10, wherein the primary transmitting device further comprises current sense circuitry to sense a current associated with the primary output power.

16. The system of claim 10, wherein the primary transmitting device further comprises differential current sense circuitry to sense a differential current between a power line associated with the primary output power and a reference line associated with primary transmitting device.

17. The system of claim 10, wherein the first and second receiver/transmitting pair device each comprises communication circuitry to communicate the data indicative of input power, the communication circuitry configured to communicate the data within 100 milliseconds.

18. The system of claim 10, wherein the first and second receiver/transmitting pair device each comprises communication circuitry to communicate the data indicative of input power, the communication circuitry configured to communicate the data within 3 milliseconds.

19. The system of claim 10, wherein the first receiver/transmitting pair device further comprises arc detection circuitry to determine an arc fault condition associated with any one of the first or second receiver/transmitting pair device, the arc fault condition based on a current or voltage associated with the first output power.

20. The system of claim 10, wherein the first receiver/transmitting pair device further comprises current sense circuitry to sense a current associated with the first output power.

21. The system of claim 10, wherein the first receiver/transmitting pair device further comprises differential current sense circuitry to sense a differential current between a power line associated with the first output power and a reference line associated with the first receiver/transmitting pair device.

* * * * *